(12) United States Patent
Sirringhaus et al.

(10) Patent No.: US 9,034,736 B2
(45) Date of Patent: May 19, 2015

(54) PATTERNING

(75) Inventors: Henning Sirringhaus, Cambridge (GB);
Jui-Fen Chang, Cambridge (GB);
Michael Gwinner, Cambridge (GB)

(73) Assignee: Cambridge Enterprise Limited,
Cambridge (GB)

( * ) Notice: Subject to any disclaimer, the term of this patent is extended or adjusted under 35 U.S.C. 154(b) by 432 days.

(21) Appl. No.: 13/383,186

(22) PCT Filed: Jul. 9, 2010

(86) PCT No.: PCT/GB2010/051130
§ 371 (c)(1),
(2), (4) Date: Jul. 17, 2012

(87) PCT Pub. No.: WO2011/004198
PCT Pub. Date: Jan. 13, 2011

(65) Prior Publication Data
US 2012/0280216 A1 Nov. 8, 2012

(30) Foreign Application Priority Data
Jul. 10, 2009 (GB) .................................. 0912034.6

(51) Int. Cl.
*H01L 21/308* (2006.01)
*H01L 51/00* (2006.01)
*G03F 7/11* (2006.01)
*H01L 51/05* (2006.01)

(52) U.S. Cl.
CPC .............. *H01L 51/0018* (2013.01); *G03F 7/11* (2013.01); *H01L 51/0016* (2013.01); *H01L 51/0017* (2013.01); *H01L 51/0043* (2013.01); *H01L 51/0583* (2013.01); *Y10S 430/162* (2013.01)

(58) Field of Classification Search
CPC ............ G03F 7/0046; H01L 21/76802; H01L 21/02274; H01L 21/3127; H01L 21/0212; H01L 27/3211; H01L 51/0018
USPC .............. 438/780; 430/322; 257/347; 347/47
See application file for complete search history.

(56) References Cited

U.S. PATENT DOCUMENTS

| 4,074,009 | A | 2/1978 | Sanders |
| 5,312,716 | A | 5/1994 | Inoki et al. |
| 6,429,457 | B1 | 8/2002 | Berggren et al. |
| 6,500,604 | B1 | 12/2002 | Dimitrakopoulos et al. |

(Continued)

FOREIGN PATENT DOCUMENTS

| EP | 1 510 861 | 3/2005 |
| EP | 1 610 399 | 12/2005 |

(Continued)

OTHER PUBLICATIONS

International Search Report and Written Opinion for PCT/GB2010/051130 dated Jul. 4, 2011.

(Continued)

*Primary Examiner* — Kenneth Parker
*Assistant Examiner* — Bo Fan
(74) *Attorney, Agent, or Firm* — Hamilton, DeSanctis & Cha LLP

(57) ABSTRACT

The present invention provides a method of patterning an electronic or photonic material on a substrate comprising: forming a film of said electronic or photonic material on said substrate; and using a fluoropolymer to protect regions of said electronic or photonic material during a patterning process.

33 Claims, 18 Drawing Sheets

(56) References Cited

U.S. PATENT DOCUMENTS

| | | |
|---|---|---|
| 6,966,997 B1 | 11/2005 | Inganas et al. |
| 2003/0203647 A1* | 10/2003 | Rockford ............... 438/780 |
| 2004/0079950 A1 | 4/2004 | Takayama et al. |
| 2004/0224263 A1* | 11/2004 | Itou et al. ............... 430/320 |
| 2005/0032453 A1 | 2/2005 | Tachikawa |
| 2005/0048414 A1 | 3/2005 | Harnack et al. |
| 2006/0008746 A1 | 1/2006 | Onishi et al. |
| 2006/0120145 A1 | 6/2006 | Ezaki et al. |
| 2006/0220126 A1 | 10/2006 | Huisman et al. |
| 2007/0205409 A1 | 9/2007 | Lecloux et al. |
| 2009/0136877 A1 | 5/2009 | Suganuma |
| 2010/0289019 A1 | 11/2010 | Katz et al. |

FOREIGN PATENT DOCUMENTS

| | | |
|---|---|---|
| JP | 2004-006231 | 1/2004 |
| JP | 2004 006231 | 8/2004 |
| SU | 1788532 | 1/1993 |
| WO | 2004/079833 | 9/2004 |

OTHER PUBLICATIONS

Defranco et al "Photolithographic Patterning of Organic Electronic Materials" Organic Electronics, vol. 7 No. 1; Nov. 18, 2005.

* cited by examiner

PL images of the patterned F8BT cover with Cytop after plasma etch (Left) and after xylene deposition (Right). A less crystalline region can be clearly seen at the edge of patterned F8BT after solvent exposure.

PATTERNING

FIELD OF THE INVENTION

This invention relates to methods of patterning electronic or photonic materials, in particular, those deposited from a liquid such as semi conducting polymers, and to patterned materials and devices fabricated using these methods.

BACKGROUND TO THE INVENTION

Solution processing of organic materials, in particular semi conductors, offers great advantages for inexpensive, large-area, mechanically flexible applications. However, the conventional deposition methods and environmental sensitivity of most organic materials still make it challenging to achieve precise patterning of solution-processed films and to integrate different functional materials yielding well-defined features without material degradation.

The performance of light-emitting diodes (LEDs) and field-effect transistors (FETs) based on solution-processible organic semiconductors has improved rapidly in recent years and is now competitive with that of conventionally vacuum deposited small organic molecules, but also with that of established inorganic technologies. Both n-type and p-type organic FETs with mobilities comparable to that of amorphous silicon based devices have been demonstrated. Deposition and patterning of these materials by a combination of solution processing and direct write printing, such as inkjet, offset or flexographic printing, has been pursued as a new paradigm for electronic manufacturing for more than a decade promising to enable low-cost, large-area electronic devices on flexible substrates. However, for many applications the solution processibility of organic materials also imposes severe limitations on their use because at present the requirements for patterning resolution, reproducibility and yield cannot always be met by standard printing techniques.

Although approaches have been developed for high resolution patterning of organic semiconductors using techniques such as scanning probe microscopy, nanoimprinting, microcontact printing, advanced ink-jet printing, selective dewetting, phase separation, physical delamination, laser ablation, and transfer printing, conventional photolithography would for many applications be the technique of choice offering the highest level of reliability. However, soluble organic semiconductors tend to dissolve, or at least swell, in the solvents used for deposition of common photoresists resulting in severe degradation of electronic and optical properties. This is particularly problematic for device configurations which rely on the electronic properties of the top surface of the organic semiconductor. If, for example, one attempts to pattern the active semiconductor layer of a top-gate organic FET by photolithography prior to deposition of the gate dielectric, severe device degradation is observed. Moreover there are no good techniques available to clean the surface of an organic semiconductor after it becomes contaminated by photoresist, developer or solvent residues.

A further consequence of the fact that the solvents used for deposposition of common photoresists tend to dissolve or swell organic semiconductors is that it is even more challenging to pattern more than one semiconducting component in a single device without compromising the overall device performance. Particularly the formation of a well-defined functional lateral heterojunction between solution-processed organic materials has not been possible so far. This is a significant limitation in terms of the fabrication of advanced heterostructure device architectures, which would enable the combination of the unique properties of individual solution-processed semiconductors.

Hence there is a need for simple, versatile, high-resolution and clean patterning methods, which are applicable to a wide range of solution-processable organic materials and can be easily integrated into all common thin-film transistor (TFT) architectures without compromising device performance. Patterning methods enabling the fabrication of high-quality lateral heterojunctions are particularly desired.

It has now been surprisingly found that photolithography may be used in combination with a protective or sacrificial polymer layer to afford a patterning method that can be applied to all common TFT architectures as well as a wide range of solution-processable organic semiconductors. Advantageously the method facilitates patterning without device degradation and allows precise alignment of the semi conductor pattern with respect to previously defined electrodes and other substrate structures. The key to the process is use of a polymer, preferably a fluoropolymer, to protect regions of the semi conductor during photolithographic patterning.

SUMMARY OF THE INVENTION

Thus viewed from a first aspect the invention provides a method of patterning an electronic or photonic material on a substrate comprising:
  forming a film of said electronic or photonic material on said substrate; and
  using a fluoropolymer to protect regions of said electronic or photonic material during a patterning process.

In a preferred embodiment the method further comprises the step of removing the fluoropolymer that remains after patterning.

Viewed from a further aspect the invention provides use of a fluoropolymer in the preparation of a patterned electronic or photonic material on a substrate, wherein said fluoropolymer protects underlying electronic or photonic material during removal of an overlying light sensitive layer remaining after patterning.

Viewed from a still further aspect the invention provides a method of making an electronic device on a substrate comprising:
  forming a film of an organic semi conductor material on said substrate;
  patterning said film of organic semi conductor material by using a protective polymer to protect regions of said organic semi conductor material during the patterning process; and
  removing the protective polymer that remains after patterning, wherein, in operation, said electronic device utilises current flow through the surface of said organic semi conductor material which is in contact with the protective layer during patterning.

In preferred embodiments, the electronic device is a light-emitting diode or a top-gate field effect transistor.

In further preferred embodiments, the method comprises the further step of depositing a dielectic on said patterned electronic or photonic material. In particularly preferred embodiments, the method comprises the yet further step of depositing a gate on said dielectric.

Viewed from a still further aspect the invention provides a method of patterning at least a first electronic or photonic material and a second electronic or photonic material on a substrate comprising:

(A) patterning said first electronic or photonic material on a substrate by a method comprising:
forming a film of said first electronic or photonic material on said substrate; and
using a protective polymer to protect regions of said electronic or photonic material during a patterning process; and
(B) patterning said second electronic or photonic material by a method comprising:
forming a film of said second electronic or photonic material on the pattern resulting from step (A); and
selectively removing those regions of second electronic or photonic material having underlying protective polymer.

Viewed from a still further aspect the invention provides the method of patterning at least a first electronic or photonic material and a second electronic or photonic material on a substrate comprising:
(a) patterning said first electronic or photonic material on a substrate by a method comprising:
forming a film of said first electronic or photonic material on said substrate; and
using a protective polymer to protect regions of said electronic or photonic material during a patterning process;
(b) depositing a further layer of protective polymer on said pattern of first electronic or photonic material and patterning said protective polymer; and
(c) forming a film of said second electronic or photonic material on the pattern resulting from step (b); and
(d) selectively removing those regions of second electronic or photonic material having underlying protective polymer.

Viewed from another aspect the invention provides a patterned electronic or photonic material on a substrate obtainable by a method as hereinbefore described.

Viewed from yet another aspect the invention provides an electronic or photonic device comprising a patterned electronic or photonic material on a substrate as hereinbefore described.

In a preferred embodiment the device is a transistor (e.g. a field effect transistor) comprising said patterned electronic or photonic material as an active semi conducting layer.

Viewed from still another aspect the invention provides an electronic or photonic device comprising:
a substrate;
a first pattern comprising a first solution-processed organic semi conductor material;
a second pattern comprising a second solution-processed organic semi conductor material;
wherein said patterns of said first and second organic semi conductor materials form a lateral heterojunction and wherein, in operation, an electrical current is flowing between said patterns of first organic semi conductor and second organic semi conductor across said lateral heterojunction.

Viewed from still another aspect the invention provides an electronic or photonic device comprising:
a substrate;
a first pattern comprising a first solution-processed organic semi conductor material (e.g. PDTTT);
a second pattern comprising a second solution-processed organic semi conductor material (e.g. P(NDI2OD-T2));
wherein said patterns of said first and second organic semi conductor materials are not in physical contact.

As used herein the term substrate is used to refer to the base on which the patterned electronic or photonic material is formed. The electronic or photonic material may or may not be formed directly on the substrate (i.e. one or more intermediate layers may be present). Nevertheless the substrate forms the platform of the overall structure.

The substrates used in the methods of the invention may be any conventional substrate used in the preparation of electronic or photonic materials. Preferred substrates are smooth, i.e. have substantially no surface roughness. Representative examples of substrates include plastics (e.g. polyethylene terephthalate or polyethylene naphthalene) metals, quartz, glass and $Si/SiO_2$. The substrate may also be coated with a metal oxide. Preferred substrates are glass and $Si/SiO_2$. An advantage of the methods of the present invention is that virtually any substrate may be used. In other words the methods of the invention do not impose restrictions on the nature of the substrate.

The substrate may optionally carry one or more device components, e.g. the substrate may carry source and drain electrodes.

As used herein the term electronic or photonic material is used to refer to any material having electron or photon conducting properties respectively. Preferred materials for use in the methods are electronic materials.

Preferred electronic or photonic materials for use in the methods of the invention are organic non-polymeric (e.g. molecular) or polymeric semi conductors, conducting polymers, polymer dielectrics or nanoparticulate material, such as nanoparticles, nanowires, or nanotubes. The methods of the invention do not, however, require the electronic or photonic materials to satisfy specific criteria and a wide range of materials may be used. Advantageously, and as discussed below in more detail, the methods of the present invention also allow patterning of more than one electronic or photonic material on a single substrate.

A preferred electronic material is an organic semi-conductor, i.e. a carbon containing material that has semi conductor properties. Organic semi conductors for use in the present invention may be polymeric or non-polymeric. Preferred polymeric and non-polymeric semi conductors are conjugated. Representative examples of non-polymeric semi conductors that may be used in the present invention include vacuum-sublimed pentacene and triisopropylsilyl-substituted pentacene (TIPS-pentacene). Preferred polymeric semi conductors are semi crystalline (e.g. have a crystallinity of at least 60% as determined by differential scanning calorimetry). Representative examples of polymeric semi-conductors that may be used in the present invention include polyfluorenes, polythiophenes, polythienylene-vinylenes and polyphenylene-vinylenes. Polymeric organic semi conductors are generally preferred.

Examples of preferred polymeric organic semi conductors include poly(3-hexylthiophene) (P3HT), poly[5,5'-bis(3-alkyl-2-thienyl)-2,2'-bithiophene)] (PQT), poly(9,9-di-n-octylfluorene-alt-benzothiadiazole) (F8BT), poly(2,5-bis(3-alkylthiophen-2-yl)thieno[3,2-b]thiophene) (PBTTT), P(NDI2OD-T2), (PSSS-C10), Poly((9,9-dioctylfluorene)-2,7-diyl-alt-[4,7-bis(3-hexylthiophen-5-yl)-2,1,3-benzothiadiazole]-2',2''-diyl) (F8TBT), Poly(9,9-dioctylfluorene) (F8 or PFO), Poly(9,9-dioctylfluorenyl-2,7-diyl)-co-(bithiophene) (F8T2), Y80F8:20F5 (F8F5)).

A particular strength of the methods of the present invention is that semi-conductors that are prone to contamination may be utilised as the methods successfully prevent damaging contamination from occurring. Thus, for example, poly-3-hexylthiophene (P3HT) and poly(2,5-bis(3-alkylthiophen-2-yl)thieno(3,2-b)thiophene) (PBTTT) which are easily p-type doped during processing, and poly(9,9-di-n-octylfluorene-alt-benzothiadiazole) (F8BT), may be used in the methods of the invention whereas these are difficult to utilise successfully in other patterning techniques.

In the methods of the present invention a film of the electronic or photonic material is initially formed on the substrate. Preferably the film of electronic or photonic material is deposited from a liquid. Particularly preferably the film of electronic or photonic material is formed by solution deposition, e.g. by spin coating.

The maximum thickness of the film of electronic or photonic material is preferably in the range 10-1000 nm, more preferably 100-500 nm, e.g. 50 to 250 nm. Preferably the thickness of the film of electronic or photonic material is less than 300 nm, still more preferably less than 200 nm.

In the methods of the present invention, the critical steps are carried out after the deposition of the film of electronic or photonic material. In the key steps, a protective or sacrificial polymer, preferably a fluoropolymer, is used to protect regions of underlying electronic or photonic material during a patterning process. Thus the key steps typically involve:
(1) deposition of a protective or sacrificial polymer (e.g. fluoropolymer) layer on top of the surface of the electronic or photonic material (e.g. organic semi-conductor layer);
(2) conventional photolithography followed by etching of the electronic or photonic material (e.g. organic semi-conductor) to define the high resolution pattern; and
(3) removal of the protective or sacrificial layer remaining after patterning.

In preferred methods of the invention the protective or sacrificial polymer (e.g. fluoropolymer) is deposited as a layer on said film of said electronic or photonic material. Preferably the protective or sacrificial polymer (e.g. fluoropolymer) is deposited from a liquid, typically a fluorosolvent. Typical fluorosolvents that may be used for this purpose include perfluorotributylamine and heptacosafluorotributylamine. Perfluorohexanes may also be used. Particularly preferably the protective or sacrificial polymer (e.g. fluoropolymer) is deposited by solution deposition, e.g. by spin coating.

It is an advantage of the methods of the present invention that the protective or sacrificial polymer can often be deposited from a fluorosolvent. Fluorosolvents are typically highly orthogonal to the solvents in which the majority of electronic or photonic materials (e.g. organic semi conductors) are soluble. As a result fluorosolvents form only a very weak interface with negligible degree of intermixing with the electronic or photonic material (e.g. organic semi conductor) such that it can be used and cleanly removed without perturbing the surface molecular ordering critical for achieving good device performance or leaving residues.

The maximum thickness of the layer of protective or sacrificial polymer (e.g. fluoropolymer) is preferably in the range 300-1000 nm, more preferably 400-800 nm, e.g. 500 to 700 nm. Preferably the thickness of the layer of protective or sacrificial polymer (e.g. fluoropolymer) is less than 900 nm, still more preferably less than 600 nm.

The protective or sacrificial polymer preferably does not degrade the surface properties of the film of electronic or photonic material to which it is applied. To the contrary, the protective or sacrificial polymer preferably protects the film of electronic or photonic material (e.g. organic semi conducting material) during the patterning process (e.g. photolithography and etching). Thus the protective or sacrificial polymer should prevent any damage or contamination occurring in the electronic or photonic material during its patterning. Preferably the protective or sacrificial polymer is substantially water insoluble so it protects the underlying electronic or photonic materials from degradation during removal of light sensitive layers or photoresists using developer. Preferably the protective or sacrificial polymer is also insoluble to the solvents used to deposit light sensitive layers or photoresists, e.g. substantially insoluble to non-fluorosolvents.

It is also preferable that the protective or sacrificial polymer can be etched by the same etch method used for the electronic or photonic material so that it can be removed simultaneously with those regions of electronic or photonic material (e.g. organic semi conductor) to be removed as part of the patterning process. Thus preferably the protective or sacrificial polymer can be etched using $O_2$ plasma etching and/or by solvent etching using conventional solvents (e.g. fluorosolvents as mentioned above).

Preferably the protective or sacrificial polymer can also be removed without leaving any residues on the surface the electronic or photonic material (e.g. organic semi-conductor). This is important as any residues remaining on the surface of the active conducting layer are likely to impact negatively on its performance. Significantly there are also few methods for removing any residues of protective or sacrificial polymer left on the surface of the electronic or photonic material that do not cause damage to the conducting properties of the electronic or photonic material.

Preferably the protective or sacrificial polymer is a fluoropolymer, particularly preferably a perfluoropolymer. The fluoropolymer may be a homopolymer or copolymer, but is preferably a copolymer. Preferred copolymers are prepared by the copolymerisation of tetrafluoroethylene and perfluoro (alkyl vinyl ethers) and/or perfluoro (alkenyl vinyl ethers). Suitable fluoropolymers for use as protective or sacrificial polymers are commericially available.

A particularly preferred fluoropolymer is Cytop® which is commercially available from Asahi Glass, Japan.

Prior to patterning the layer of protective or sacrificial polymer, e.g. fluoropolymer, is preferably modified by depositing on its surface an energy modification layer. The surface energy modification layer is preferably hydrophilic or amphiphilic (e.g. hydrophilic). Any hydrophilic or amphiphilic compound capable of forming a thin layer and that can be removed by etching, preferably under the same conditions as the electronic or photonic material, may be used. An exemplary material is aluminium.

The surface energy modification layer may be applied to the protective or sacrificial polymer using any conventional method. For example, the modification layer may be deposited by transfer printing. In a preferred method, however, the surface energy modification layer is deposited from liquid, e.g. by solution deposition.

Where present the thickness of the surface energy modification layer (e.g. aluminium) is preferably in the range 0.1-10 nm, more preferably 0.5-5 nm, e.g. about 1 nm. Such thicknesses mean that the layer is facile to remove by etching.

In preferred methods of the invention, the patterning process comprises photolithography comprising the use of a light sensitive layer and etching. The fact that patterning is carried out using this conventional procedure is highly advantageous since it is well established in the art how the process should be done. A wide range of materials necessary for carrying out photolithography are also commercially available thus it is facile to implement.

A typical photolithography procedure will involve the steps of:
(i) depositing a layer of light sensitive material (photoresist) onto the protective or sacrificial polymer, or where present, the surface energy modification layer;
(ii) using a photomask to selectively expose regions of the photoresist to light;

(iii) removing those regions of photoresist exposed to light using developer;
(iv) etching those regions of protective or sacrificial polymer no longer protected by photoresist (e.g. using $O_2$ plasma); and
(v) removing the remaining photoresist.

In the methods of the invention the protective or sacrificial polymer (e.g. fluoropolymer) protects regions of the electronic or photonic material during the photolithography process. Thus, for example, the protective or sacrificial polymer protects the electronic or photonic material during desposition of the light sensitive material in step (i). It also protects the electronic or photonic material from exposure to developer during step (iii). Additionally in step (v) the protective or sacrificial polymer (e.g. fluoropolymer) protects the regions of underlying electronic or photonic material during removal of the corresponding regions of the light sensitive layer that remain after patterning.

Thus in preferred methods of the invention, the patterning process comprises:
(a) depositing a light sensitive layer on said fluoropolymer, or where present said surface energy modification layer;
(b) patterning said electronic or photonic material using photolithography and etching; and
(c) removing the regions of the light sensitive layer that remain after patterning,
wherein said fluoropolymer protects regions of said electronic or photonic material during any of steps (a), (b) and/or (c).

Some embodiments of the methods of the invention comprise a further step of removing the regions of protective or sacrificial polymer (e.g. fluoropolymer) that remain after patterning. Advantageously this may be achieved in two different ways. The fluoropolymer may, for example, be removed by dissolution in a solvent (e.g. a fluorosolvent). The fluorosolvents discussed above as being suitable for solution deposition of fluoropolymers may be used for this purpose. Also as discussed above, the use of fluorosolvents is advantageous as they are highly orthogonal to the majority of electronic or photonic materials and hence do not cause any damage to their surface. The use of a fluorosolvent is generally preferred in the fabrication of bottom-gate FETs.

Alternatively the protective or sacrificial polymer (e.g. fluoropolymer) may be removed using an adhesive. The use of an adhesive is generally preferred in the fabrication of top-gate FETs.

The adhesive used in preferred methods is on a carrier. Preferably the carrier has a non-adhesive side. This enables the adhesive to adhere to the material underneath it but at the same time to be easily handled. In preferred methods the adhesive is in the form of a laminate, e.g. a strip or sheet of material. Thus in preferred methods, the adhesive is laminated onto an underlying material. More preferably the adhesive is on the form of a tape, particularly a tape that can conform to the shape of the material to which it is applied. Pressure may be applied to the adhesive to improve its adhesion. Adhesives in the form of tapes are preferred as they can easily be removed by peeling. Commercially available adhesive tape, such as 3M Scotch tape, may be used. If necessary, the use of adhesive may be applied more than once (e.g. twice, three or a plurality of times) to ensure the desired removal of protective or sacrificial polymer (e.g. fluoropolymer) is achieved.

The above-described steps are illustrated schematically in FIG. 1. Referring to FIG. 1 firstly, the thin film of electronic or photonic material to be patterned is deposited (e.g. spin-coated) onto the substrate, which preferably already contains other structures, such as source/drain electrodes. Subsequently, a protective polymer (Cytop) layer (~500-700 nm) is spun on top (1). Due to its relatively low surface energy, it is very difficult to deposit photoresist (Shipley 1813) on top of the Cytop layer (2). Therefore, prior to photolithography it is required to make the Cytop surface hydrophilic. $O_2$ plasma treatment of the Cytop surface could cause serious damage to the semiconducting polymer/Cytop interface. Therefore, a thin layer of aluminum (1-2 nm) was deposited on top of the Cytop layer to render its surface sufficiently wetting. Such a thin aluminum layer is not conductive and can be etched within a few seconds in the developer of the photolithography process. By using a positive photoresist the regions where the film of electronic or photonic to remain on the substrate are protected by the photomask during the photolithography exposure (3). Hence, no UV-induced degradation can occur in these regions. Subsequently, the exposed photoresist and the thin aluminum layer underneath are removed using Shipley MF319 developer (4). It is important to note that during this processing step, which involves immersion into aqueous solutions, the underlying electronic or photonic material is protected by the water-repelling Cytop. In the next step, the Cytop and the electronic or photonic material in the regions no longer covered by the photoresist are etched by $O_2$ plasma at 300 W for 10-20 min (5). The residual photoresist is then stripped with acetone (6). During this step the Cytop remaining after photolithography protects the underlying electronic or photonic material. The remaining Cytop film can finally be removed from the patterned electronic or photonic material in two different ways (7): (a) by using a fluorosolvent to dissolve Cytop, or (b) by using adhesive tape (e.g., 3M Scotch tape) to delaminate the patterned Cytop and photoresist films. Method (a) is generally applicable and allows removal of patterned films with fine features of only a few micrometers and of patterns deposited on hydrophobic surfaces, whereas (b) allows patterns with larger features on a 100 μm scale on hydrophilic surfaces with good adhesion between the substrate and the organic semiconductor.

A significant advantage of the methods hereinbefore described is their versatility. In other words, the methods may be used to pattern the active semi conducting layer of a broad range of devices, particularly LEDs and transistors (e.g. field effect transistors). This includes bottom-gate, top-gate, p-type and n-type FETs as well as ambipolar organic FETs based on both polymers and/or small molecules.

The methods of the invention are particularly advantageous in the fabrication of light emitting diodes and top gate field-effect transistors, i.e. transistors wherein, in operation, current flows through the surface of the semi conducting layer that is in contact with the protective polymer during the patterning process. As illustrated in FIG. 1, devices are typically assembled in layers from the bottom upwards, thus this surface of the semi conductor layer tends to be the one that is most exposed to chemicals and processing steps during the patterning of the electronic or photonic material. As such it is the most prone to contamination and damage which to date has resulted in a corresponding decrease in device performance.

In a preferred method of making or fabricating an electronic device wherein, in operation, current flows through the surface of the organic semi conductor material that is in contact with the protective polymer during patterning, the protective or sacrificial polymer is a fluoropolymer.

In a particularly preferred method of making or fabricating an electronic device wherein, in operation, current flows through the surface of the organic semi conductor material that is in contact with the protective polymer during patterning, the patterning of the film of electronic or photonic material is carried out by the method hereinbefore described.

These methods are particularly useful as they cause little, or no, damage to the conducting surface of the electronic or photonic material.

The methods of the present invention are also especially useful in the fabrication of devices comprising two or more (e.g. two or three) electronic or photonic materials, e.g. two or three organic semi-conductors. To date it has been extremely difficult to produce devices comprising two semi-conducting polymers because of the requirement for the two semi-conductors to dissolve in orthogonal solvents. This problem is, however, overcome by the methods of the present invention. The methods of the present invention can therefore be advantageously used in the fabrication of, for example, complementary inverters and ambipolar light-emitting transistors with undegraded electrical transport and radiative recombination properties of an consisting of two joint semi conducting polymers. The methods of the present invention open numerous new possibilities of realizing multi-polymer component devices for versatile optoelectronic applications.

The methods of the present invention are particularly useful in the fabrication of devices wherein the first and second materials form a lateral heterojunction. By a lateral heterojunction is meant that the first and second electronic or photonic materials have a lateral interface. Preferably the first and second electronic or photonic materials are in physical contact at an edge. Still more preferably the first and second materials approach each other to a distance of less than 10 nm, more preferably to a distance of less than 1 nm. In other words, the overlap between the first and second electronic or photonic materials at the edge is less than 10 nm, more preferably less than 1 nm, as determined by the method described henceforth in the examples.

In a preferred method for the fabrication of lateral heterojunctions, the methods hereinbefore described are used to pattern the first electronic or photonic material on a substrate, then a film of said second electronic or photonic material preferably fills the pattern of said first electronic or photonic material, overlaps the edges of said pattern and has regions extending beyond the edges of said pattern. Preferably the film of said second electronic or photonic material is continuous.

In particularly preferred methods for the fabrication of lateral heterojunctions, the surface of the pattern resulting from step (A) is modified with a surface energy modification layer prior to desposition of the second electronic or photonic. Still more preferably a surface energy modification layer is desposited on the protective polymer prior to the patterning process of step (A). In this latter case the structure that results from step (A) is a pattern comprising layers of each of substrate, first electronic or photonic material, protective polymer and surface energy modification layer.

The surface energy modification layer preferably comprises a hydrophilic compound, so that adhesion to subsequently deposited protective or sacrificial polymer is strengthened. Organosilanes are preferred as they can self-assemble into a monolayer. Preferred modification layers have a uniform thickness.

The surface energy modification layer may be deposited by any conventional method, e.g. spin coating. Where present the thickness of the layer of surface energy modification layer (e.g. organosilane) is preferably in the range 0.1-10 nm, more preferably 0.5-5 nm.

As used herein the term "continuous film" is used to refer to a film that does not have any interruptions or breaks therein. The continuous film may or may not have a uniform thickness. The continuous film may be planar or non-planar. A change in thickness and/or plane does not constitute an interruption or break of the film, i.e. it is still considered to be continuous. When the film is continuous the pattern on the substrate may be more reliably filled with electronic or photonic material and better definition produced in the resulting patterned material.

Selective removal of those regions of second electronic or photonic material having underlying protective polymer is preferably achieved by use of an adhesive. An adhesive facilitates selective removal of the second electronic or photonic material from those regions having underlying protective or sacrificial polymer because where protective or sacrificial polymer is present the adhesion between it and the first electronic or photonic material is weaker than the adhesion between the protective or sacrificial polymer and the second electronic or photonic material. If necessary a surface energy modification layer may be deposited on the protective or sacrificial polymer prior to deposition of the second electronic or photonic material to ensure that this is the case as described above. The selective removal of the second electronic or photonic material and protective polymer may occur in two separate steps but preferably occurs simultaneously. Simultaneous removal usually results due to the weak adhesion between the first electronic or photonic material and the protective polymer. Preferred features of adhesive are as hereinbefore described.

Alternatively selective removal of those regions of second electronic or photonic material having underlying protective polymer may be achieved by dissolution with a solvent, e.g. a fluorosolvent. In this case the solvent dissolves the protective polymer but not the first or second organic or photonic materials. Penetration of the solvent to the protective polymer typically occurs via the side walls of the regions of protective polymer.

These steps are schematically illustrated in FIG. 11. Referring to FIG. 11 a first electronic or photonic material (e.g. a F8BT) protected by fluoropolymer (Cytop®) was initially patterned by photolithography to cover about half of the FET channel. The second electronic or photonic material (e.g. TFB) film was then deposited from a xylene solution with the Cytop protective layer being still on top of the F8BT. Since F8BT is highly soluble in xylene, the patterned Cytop layer protects the F8BT film from being dissolved in xylene. The TFB film on top of the patterned F8BT film was then removed together with the Cytop layer using an adhesive and resulting in the formation of a lateral heterojunction.

The methods of the invention as hereinbefore described may also be utilised to fabricate devices wherein the first and second electronic or photonic materials exist as separate regions (i.e. are not in physical contact). In particularly preferred methods of fabricating such devices the film of the second electronic or photonic material fills the pattern of said protective or sacrificial polymer, overlaps the edges of said pattern and has regions extending beyond the edges of said pattern. Still more preferably the film of said second electronic or photonic material is continuous.

In preferred methods of patterning at least a first electronic or photonic material and a second electronic or photonic material on a substrate wherein the first and second materials exist as separate regions, the surface resulting from step (a) is modified with one or more surface energy modification layers prior to deposition of the second electronic or photonic material. In this case the surface energy modification layer(s) preferably comprises a hydrophobic compound, e.g. an organosilane, so that adhesion to subsequently deposited protective or sacrificial polymer is weakened. Organosilanes are preferred as they can self-assemble into a monolayer. Preferred modification layers have a uniform thickness. Representative examples of organosilanes that can be used for modification of the substrate include alkyltrichlorosilanes (e.g. octyltrichlorosilane (OTS)), perfluorotrichlorosilanes, PFDT and hexamethyldisilazane (HMDS).

The surface energy modification layer may be deposited by any conventional method, e.g. spin coating. Where present the thickness of the layer of surface energy modification layer (e.g. organosilane) is preferably in the range 0.1-10 nm, more preferably 0.5-5 nm, e.g. about 1 nm when OTS is used and <1 nm when HMDS is used.

As in the preparation of lateral heterojunctions, selective removal of those regions of second electronic or photonic material having underlying protective polymer may be achieved by use of an adhesive. An adhesive facilitates selective removal of the second electronic or photonic material from those regions having underlying protective or sacrificial polymer because where protective or sacrificial polymer is present the adhesion between it and the first electronic or photonic material is weaker than the adhesion between and the protective or sacrificial polymer and the second electronic or photonic material. If necessary a surface energy modification layer as hereinbefore described may be deposited on the protective or sacrificial polymer prior to deposition of the second electronic or photonic material to ensure that this is the case. Preferred features of adhesive are as hereinbefore described These steps are schematically illustrated in FIG. 10. FIG. 10 shows a schematic process flow for patterning separate PBTTT and P(NDI2OD-T2) islands in a complementary inverter. A P(NDI2OD-T2) film was first deposited to cover the whole substrate and patterned P(NDI2OD-T2) by the method hereinbefore described to cover the n-channel region. The resulting pattern was then modified with self-assembled monolayers (SAMs) (e.g., octyltrichlorosilane (OTS) on glass and PFDT on Au electrodes) to weaken the adhesion between the substrate and the subsequently deposited Cytop so that Cytop can be easily delaminated. Afterwards, further Cytop was deposited and etched in the p-channel region and then a PBTTT film was spin-coated to cover the p-channel region. The Cytop/PBTTT above the SAMs/P(NDI2OD-T2) regions was delaminated with a 3M scotch tape.

In devices comprising a second electronic or photonic material the maximum thickness of its layer is preferably in the range 10-1000 nm, more preferably 100-500 nm, e.g. 50 to 250 nm. Preferably the thickness of the film of second electronic or photonic material is less than 300 nm, still more preferably less than 200 nm. Preferably the second electronic or photonic material is deposited by solution processing.

In devices comprising at least a first and second electronic or photonic material, one of said first and second electronic or photonic materials is preferably an electronic material and the other is a photonic material. A preferred device is a LEFET. Another preferred device is a complementary inverter.

Significantly the methods of the present invention can be further extended to the fabrication of devices comprising a third pattern comprising an electronic or photonic material (e.g. an organic semi conductor). The third pattern may comprise a different electronic or photonic material to said first and second patterns. Alternatively the third pattern may comprise the same organic semi conductor as one of said first or second patterns.

The methods of the present invention may therefore be utilised for the fabrication of devices comprising more than one (e.g. two) lateral heterojunctions, e.g. light emitting field effect transistors (LEFETs).

Ambipolar LEFETs constitute a powerful architecture, as it can be combined with a low-loss resonator geometry. However, the major obstacle to their development to date, is that particularly in the case of polymers high luminescence efficiencies and balanced high mobilities are difficult to combine in a single material. The methods hereinbefore described, however, may be used to fabricate heterojunctions inside the LEFET channel that overcome this problem.

An architecture that combines the individual advantages of polymers A, B and C is a lateral ABC heterostructure as illustrated in FIG. 18 may be prepared by the methods of the invention. This structure decouples the high-mobility and high-luminescence materials within the LEFET. The principle of this device relies on the fact that electrons and holes are injected from the source/drain electrode (typically gold) into material A and C, respectively, before they drift alongside the channel until they reach the opposite edge of the material B ridge. Electrons and holes are then capable of crossing the junction into the B region from opposite sides before they recombine radiatively. As the mobilities of A and C can be several orders of magnitude higher, and the polymer heterojunctions exhibit a smaller injection barrier into B than directly from the electrodes, the overall effective mobilities are expected to be considerably higher.

Combined with the fact that the recombination can be forced to occur inside the B ridge in the middle of the channel, this should result in enhanced exciton densities, and hence light emission intensities, which are required to yield electrically pumped lasing.

The methods hereinbefore described may be used to fabricate these structures. In particular two subsequent patterning processes including photolithography followed by delamination may be performed in order to create the ABC heterojunction. Alternatively, an even easier and more straight-forward case is given when the materials A and C are identical. This means that the material A/C exhibits high ambipolar mobilities and thus supports excellent electron and hole transport. PSSS-C10 is such a material for example. In this case, only one patterning step has to be performed, creating a (narrow) ridge within the middle of the transistor channel, which consists of B. Subsequently, a film of the material A is spun on top of material B followed by a layer of Cytop. After the Cytop and the overlying undesired material B are lifted-off, the LEFET device can be finished by spinning the dielectric (e.g. PMMA) and depositing the top-gate electrode.

BRIEF DESCRIPTION OF THE DRAWINGS

The versatility of the methods of the invention have been demonstrated by applying them to pattern the active semi conductor layer of a broad range of top-gate, p-type, n-type as well as ambipolar organic FETs based on both polymers and small molecules. This includes several semi conducting polymers that are very prone to processing-induced materials degradation, such as poly-3-hexylthiophene (P3HT) and poly (2,5-bis(3-alkylthiophen-2-yl)thieno(3,2-b)thiophene) (PBTTT), which are easily p-type doped during processing, and poly(9,9-di-n-octylfluorene-alt-benzothiadiazole) (F8BT), which is capable of ambipolar conduction, as well as the realization of ambipolar light-emitting field-effect transistors (LEFETs), but for which n-type, electron transport degrades rapidly upon exposure to the atmosphere. Organic LEFETs have recently attracted increasing interest because they combine the switching functionality of an FET with efficient light-generation in a single device.

A particularly powerful attribute of the methods of the invention is that it allows fabrication of well-defined lateral heterojunctions between two semiconducting polymers. These have been challenging to realize with solution-processed polymers, but they enable a broad range of novel planar architectures for optoelectronic devices that have so far only been realized with vacuum-deposited, insoluble small molecule organic semiconductors. Such an architecture is exemplified henceforth with an ambipolar light-emitting polymer field-effect transistor, in which the recombination zone is pinned within the channel at the lateral heterojunction between two semiconducting polymers.

Figure 1:
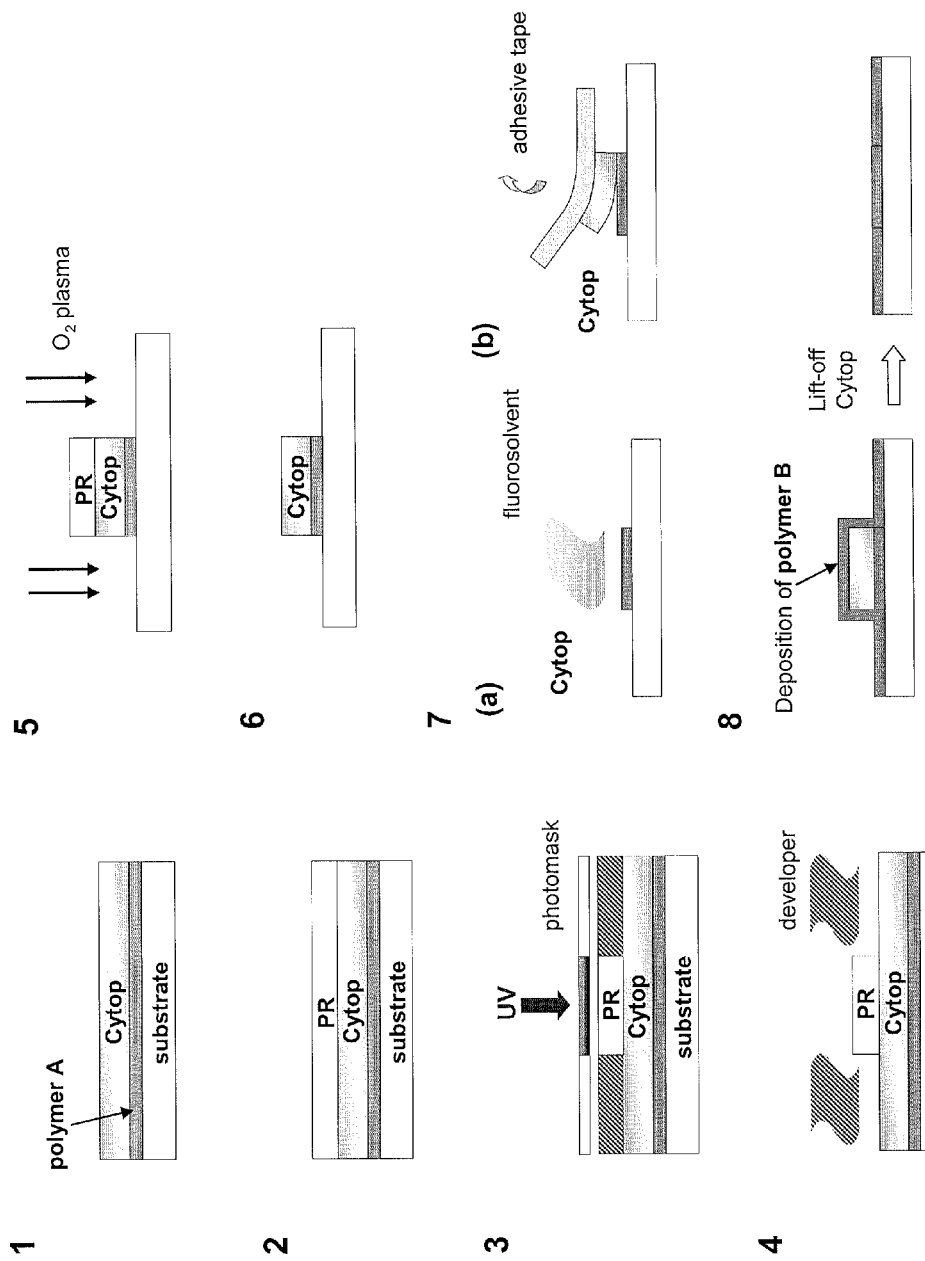

The invention will now be described in detail with reference to the following figures:

FIG. 1. Schematic process flow for patterning semiconducting polymer thin films. A Cytop (fluoropolymer) layer is used as a protective layer during photolithography. For monopolymer patterning, the Cytop layer may be removed by dissolving it in a fluorosolvent or by solvent-free, physical delamination with adhesive tape. For multi-polymer patterning, the patterned Cytop layer may be used to protect the first patterned semi conductor polymer while depositing the second semi conductor. Physical delamination of the patterned Cytop furnishes the heterostructure.

Figure 2:
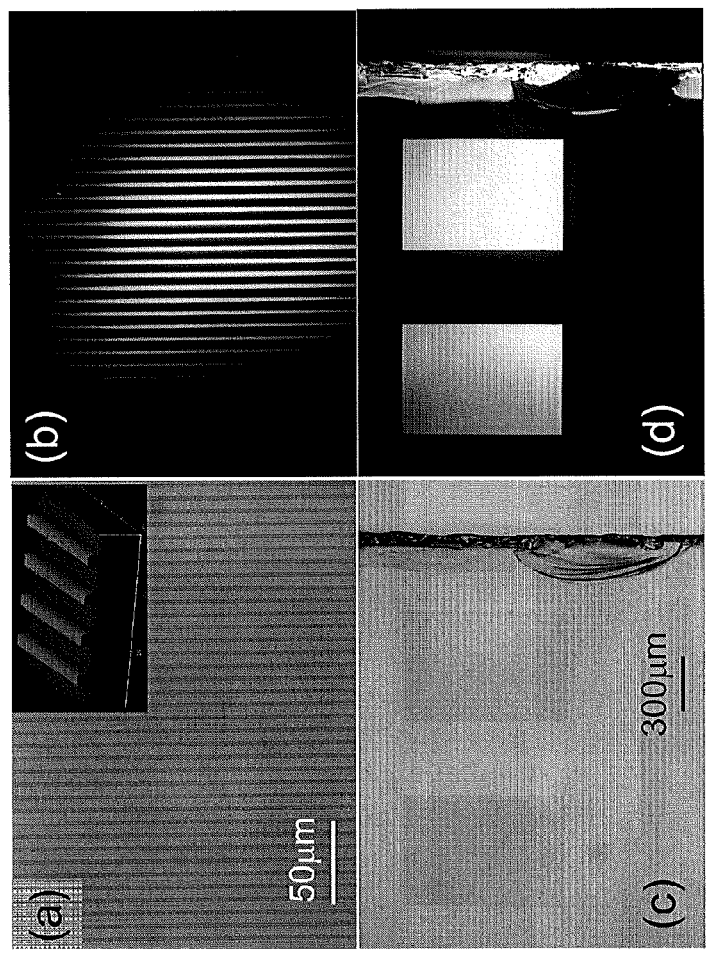

FIG. 2. Optical images of patterned polymers. a, Patterned F8BT strips with 2 μm ridge width separated by 5 μm over several hundreds micron area. The Cytop on top of the F8BT ridges is removed by dissolving in fluorosolvent. The inset shows a topography image performed by tapping-mode AFM. b, Corresponding PL image of a. c, Patterned F8BT films on glass after delaminating Cytop with an adhesive tape and d, corresponding PL image.

Figure 3:
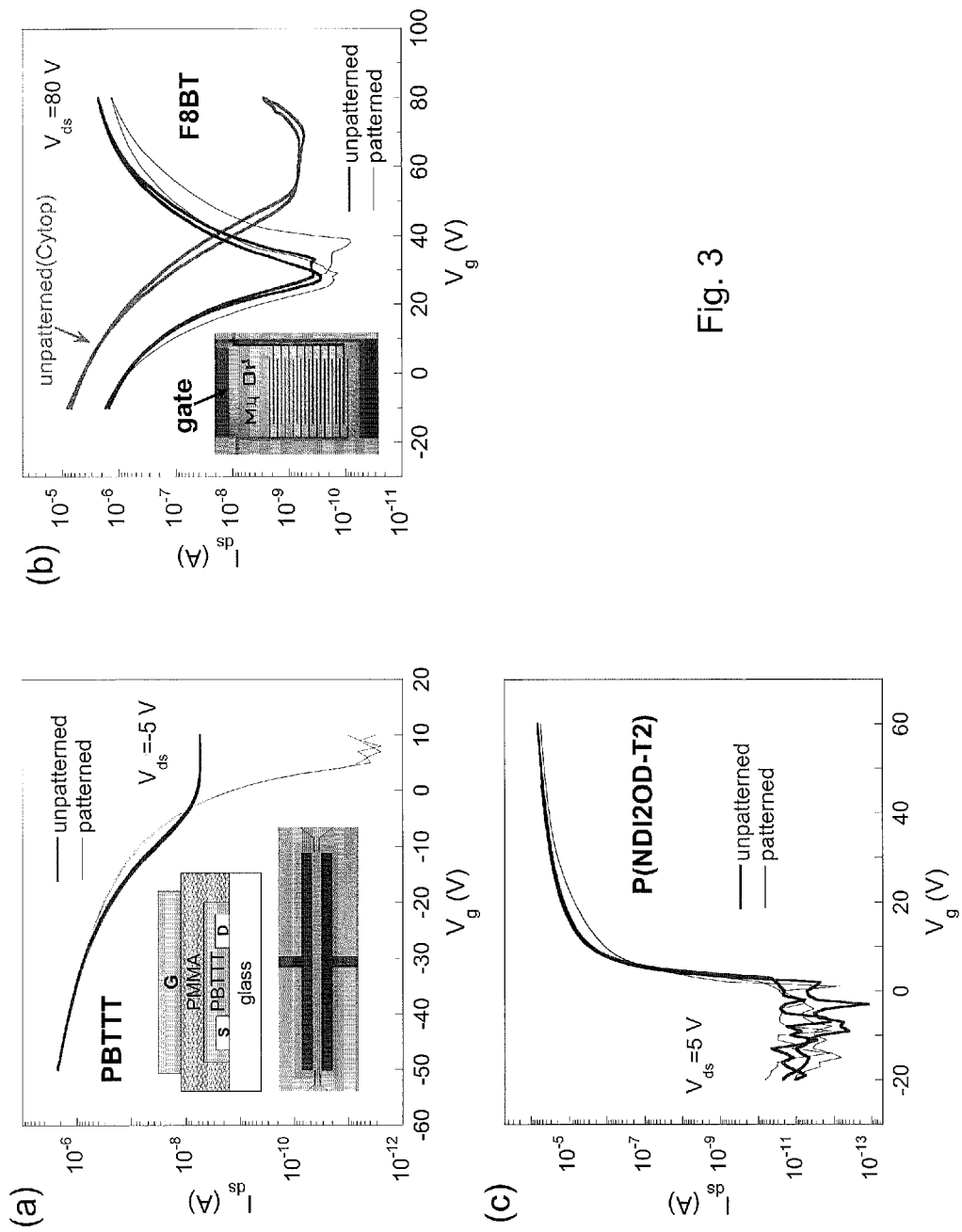

FIG. 3. Comparison of patterned and unpatterned TFT performance for various polymers. Transfer characteristics for a, PBTTT on top-gate/bottom-contact devices (L=40 μm and W=1000 μm) with 500 nm thick PMMA dielectric. The image of the patterned PBTTT and schematic diagram of the device are shown in the inset. b, N-type transfer plots of top-gate/bottom-contact F8BT devices (L=40 μm and W=20,000 μm). 500 nm thick PMMA was used as the gate dielectric for PBTTT and F8BT devices. c, Transfer plot for P(NDI2OD-T2) top-gate/bottom-contact devices (L=40 μm and W=20,000 μm) with 500 nm Cytop as the gate dielectric.

Figure 4:
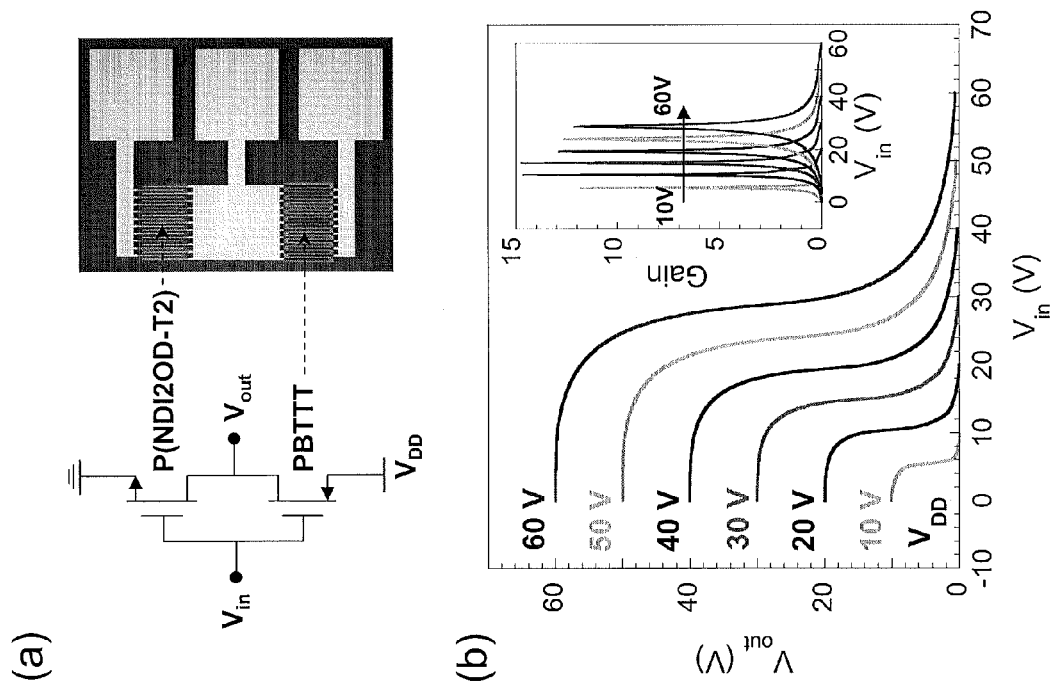

FIG. 4. Patterning of multi-component semiconductors for complementary inverters. a, Schematic illustration of an inverter and optical microscope image of patterned PBTTT in the p-channel and P(NDI2OD-T2) in the n-channel. b, Switching characteristics of an inverter.

Figure 5:
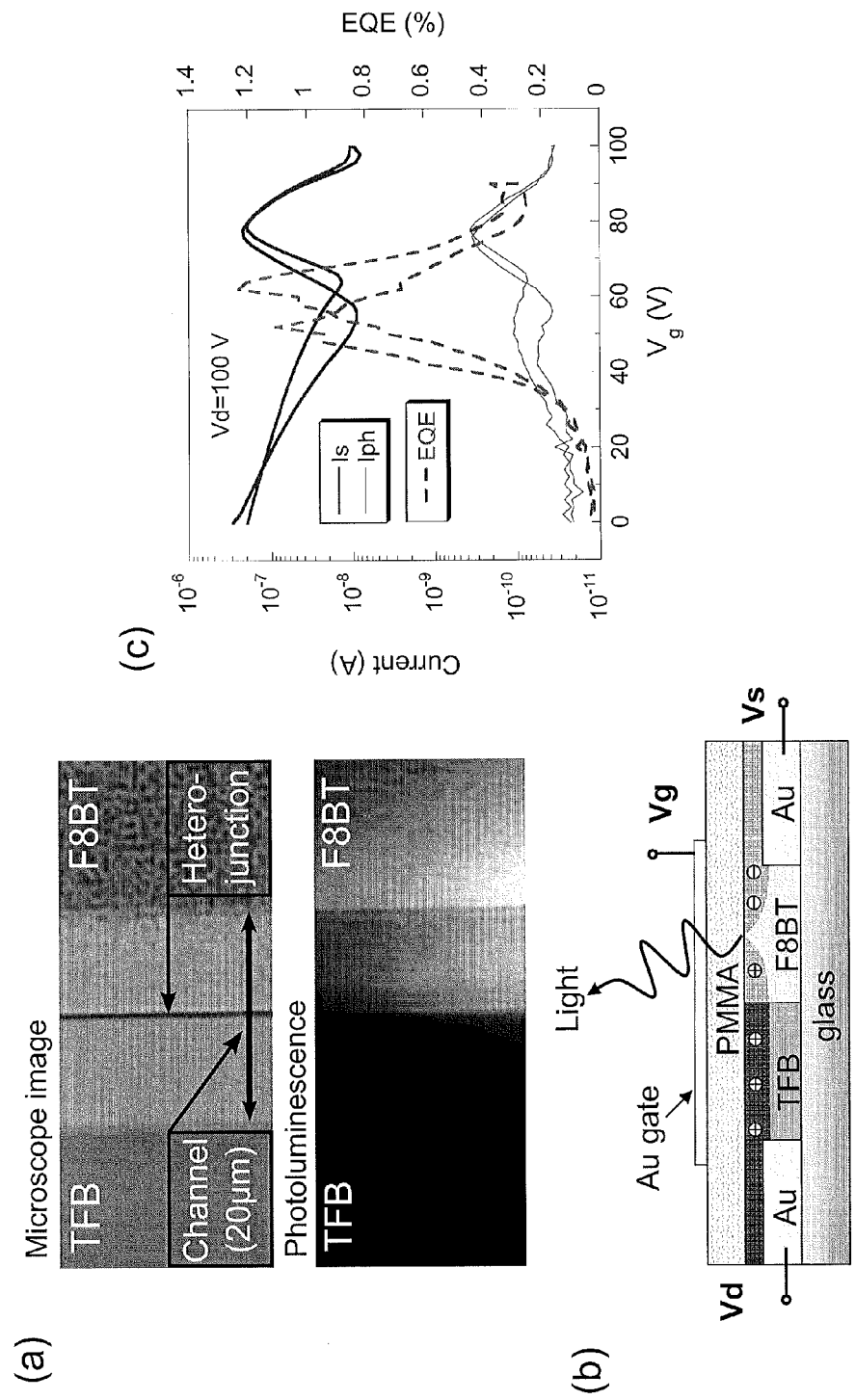

FIG. 5. Schematic illustration and device characteristics of F8BT/TFB heterojunction LEFET. a, Optical microscope and PL image of a F8BT/TFB heterojunction within the FET channel. b, Schematic illustration of a top-gate/bottom-contact LEFET with gold source/drain electrodes (20 nm thick), patterned F8BT/TFB (both about 40 nm thick) heterojunction in the middle of channel, PMMA as the gate dielectric (~500 nm), and a semitransparent (10 nm) Au stripe as top-gate electrode. Also drawn are the electron and hole accumulation layers when the LEFET operates in the ambipolar regime, and radiative recombination occurs in the F8BT. c, Detected photocurrent (Iph) and calculated external quantum efficiency (EQE), deduced from the simultaneously recorded source current (Is), of a heterojunction LEFET with L=20 μm, W=4000 μm at Vd=100 V (Vs=0 V) during a transfer scan with varying gate voltage Vg FIG. 6. Light emission from F8BT/TFB heterojunction LEFET. Digital camera snapshot images of the recombination zone during a transfer scan at Vd=200 V and varied Vg. The position is kept constant and can be correlated to the channel images showing also the actual heterojunction. The recombination zone starts off from the F8BT electrode at Vg=70 V, reaching heterojunction at Vg=100 V and is pinned for higher Vg with steadily decreasing intensity.

Figure 7:
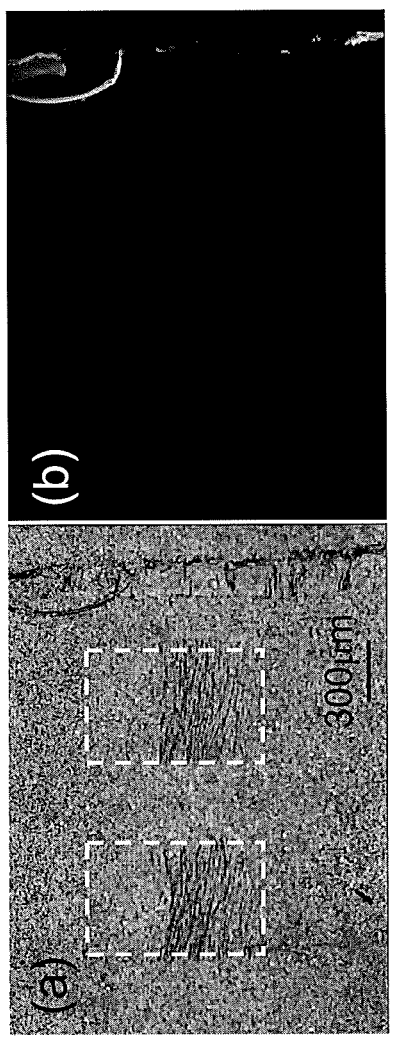

FIG. 7. (a) Patterend Cytop layer being delaminated from the patterned F8BT films on a 3M Scotch tape. Due to the high transparency of Cytop, the areas corresponding to the patterned F8BT films are indicated with dashed lines. (b) PL image of (a), showing no F8BT residual on the delaminated Cytop surface.

Figure 8:
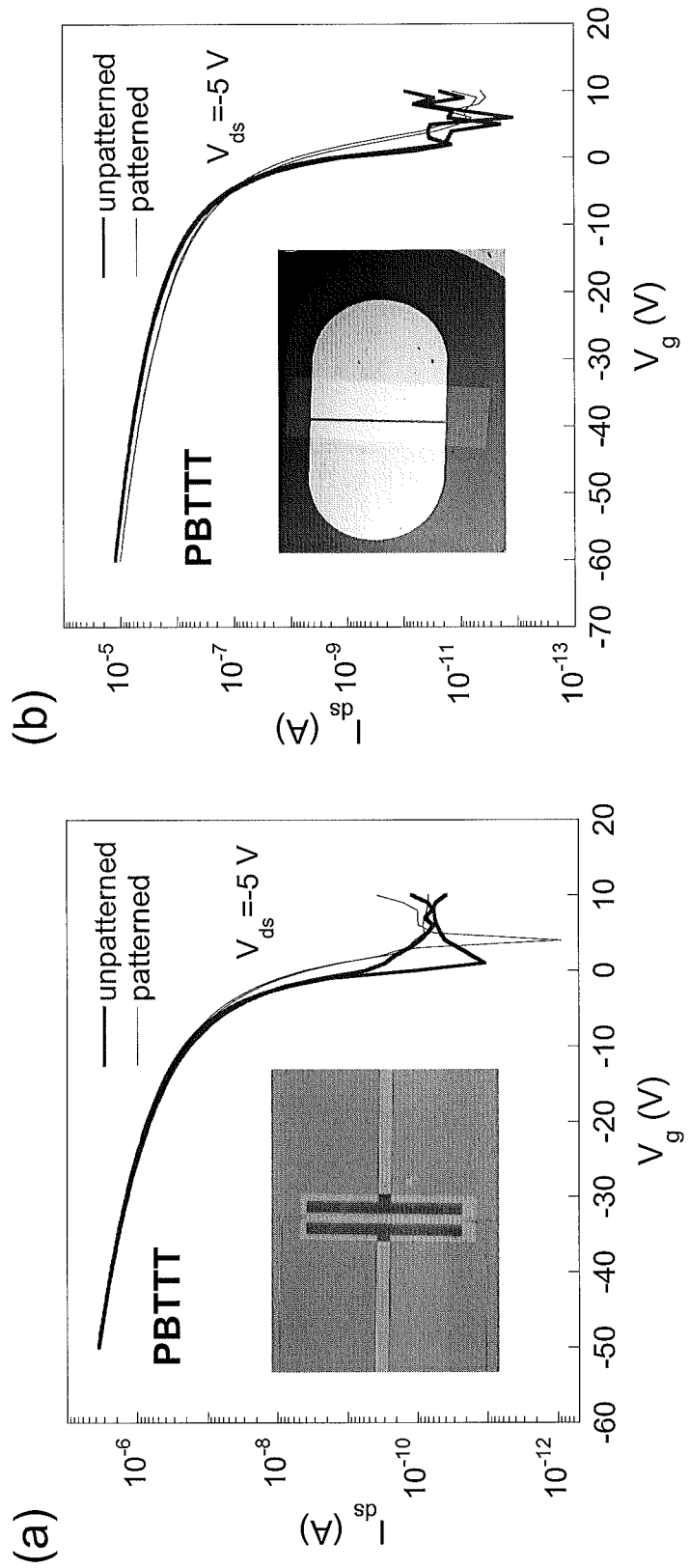

FIG. 8. Transfer characteristics of patterned/unpatterned PBTTT on (a) bottom-gate/bottom-contact devices (L=40 μm and W=600 μm) and (b) bottom-gate/top-contact devices (L=20 μm and W=1000 μm).

Figure 9:
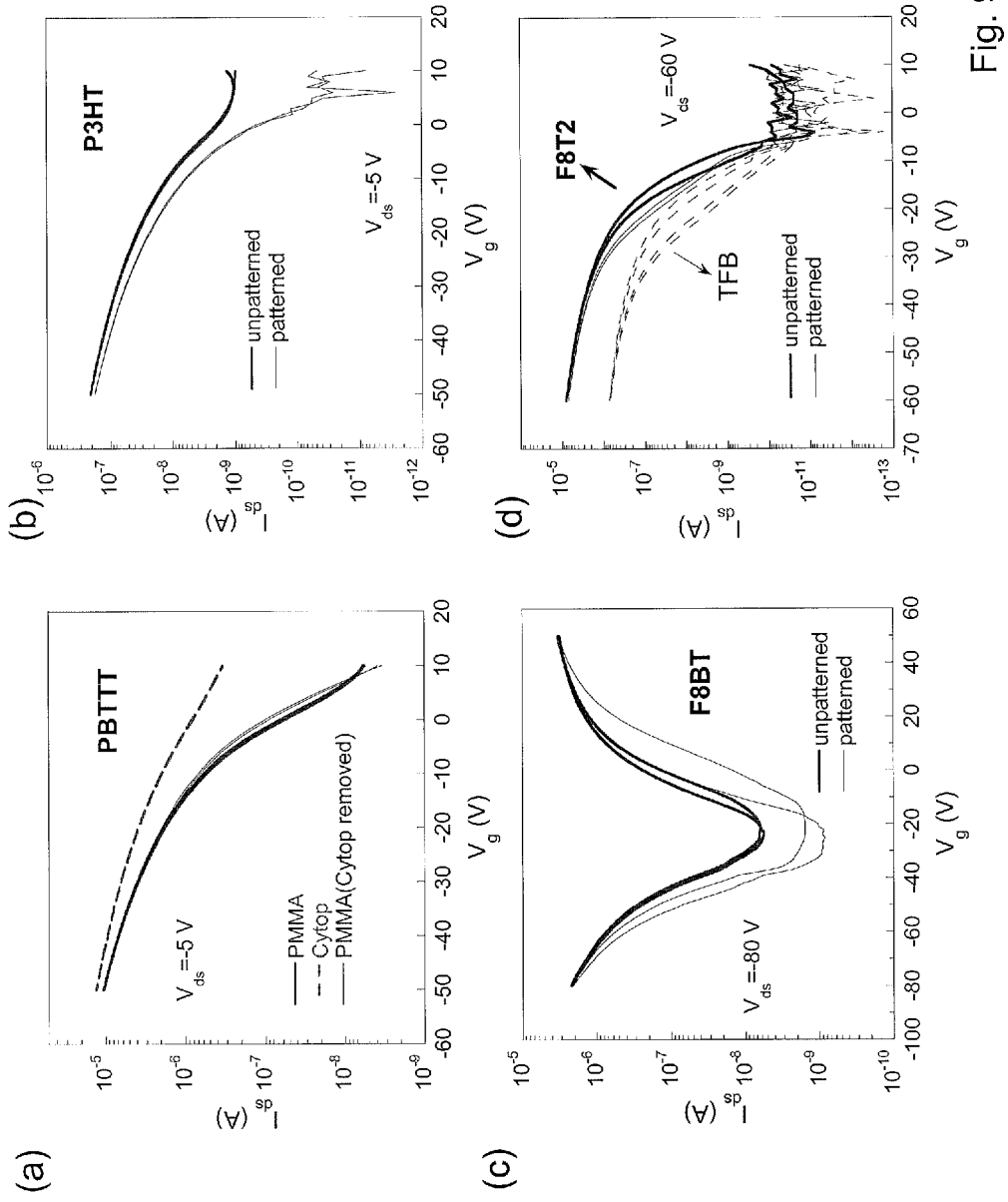

FIG. 9. (a) Transfer characteristics of unpatterned PBTTT top-gate TFTs with directly deposited PMMA and Cytop dielectrics, and re-deposited PMMA dielectric after delaminating Cytop dielectric. (b) Top-gate/bottom-contact P3HT devices (L=40 μm and W=1000 μm). (c)(d) Top-gate/bottom-contact devices (L=40 μm and W=20,000 μm) for various polyfluorene polymers. 500 nm thick PMMA was used as the gate dielectric for all the devices.

Figure 10:
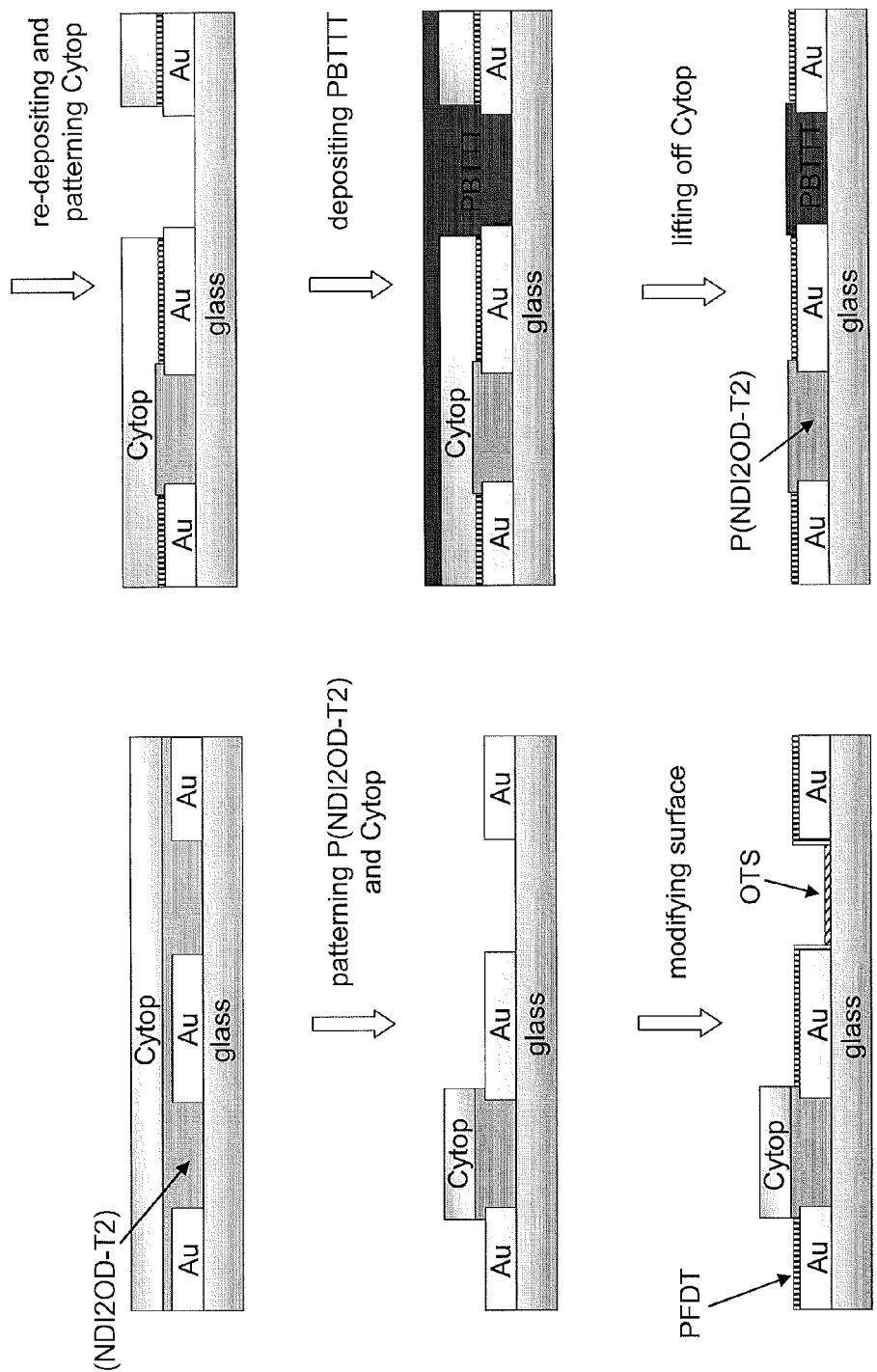

FIG. 10. Schematic process flow of the patterning of an PBTTT/P(NDI2OD-T2) complementary inverter and F8BT/TFB heterojunction inside a bottom contact TFT.

Figure 11:
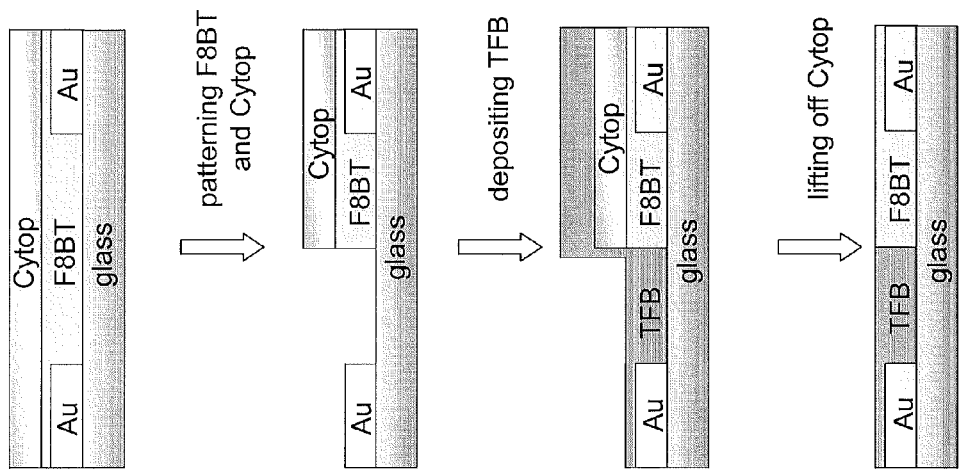

FIG. 11. Schematic process flow of the patterning of two polymers into separate islands.

Figure 12:
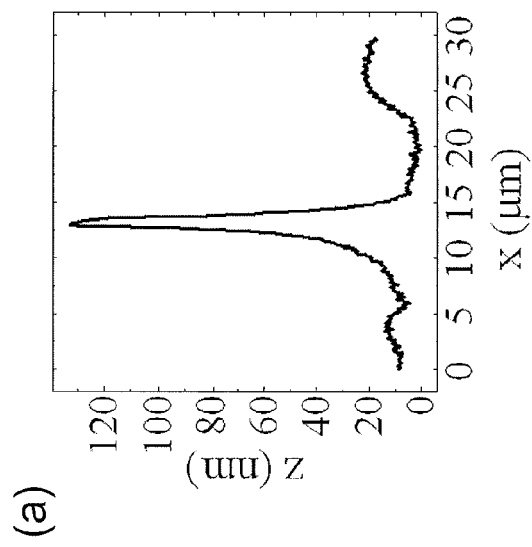
Figure 12:
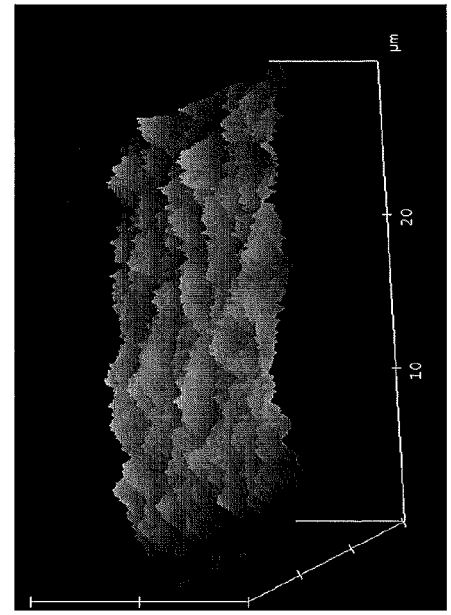
Figure 12:
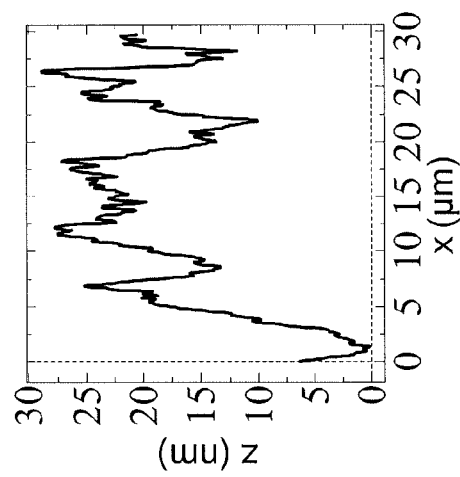

FIG. 12. (a) AFM height profile across the channel. (b) AFM image showing the topography of the F8BT side with a slightly thinner F8BT adjacent to the heterojunction.

Figure 13:
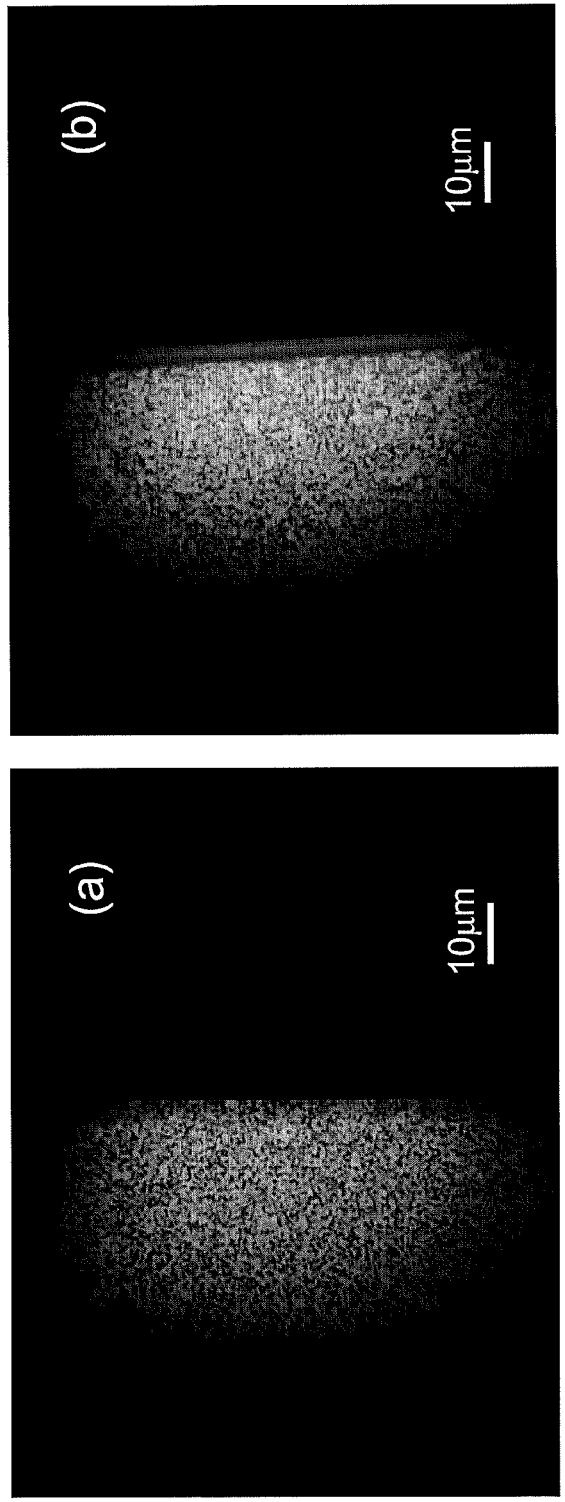

FIG. 13. PL images of a patterned F8BT film covered with Cytop after the $O_2$ plasma etch before (a) and after (b) a subsequent xylene spinning on top.

Figure 14:
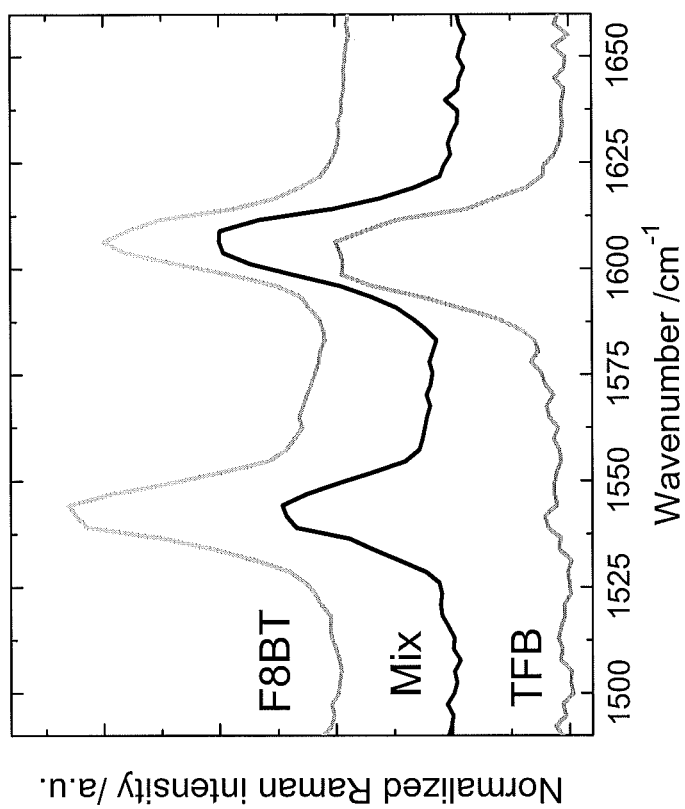
Figure 14:
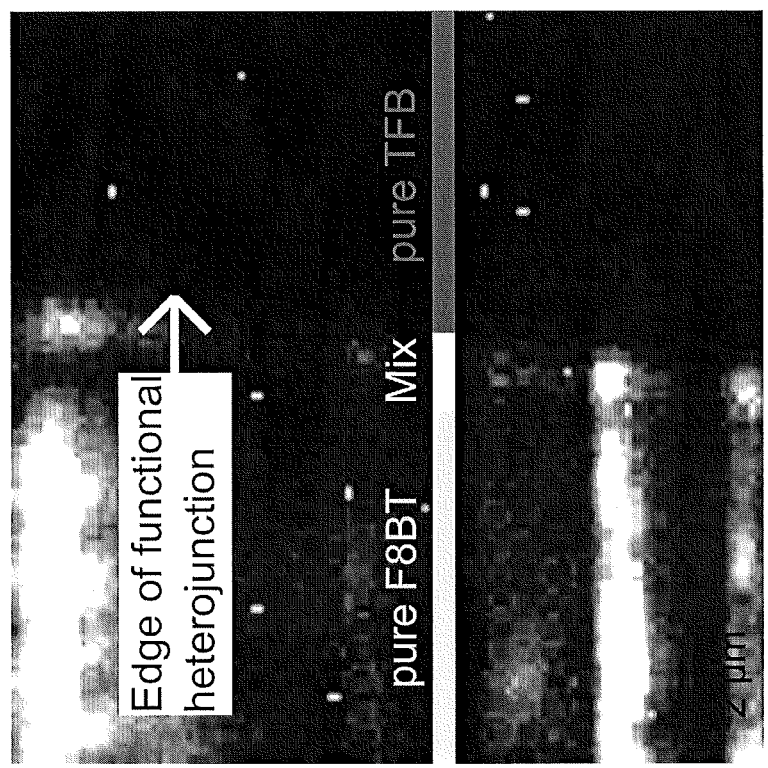

FIG. 14. 2D Raman image and spectra taken in three different lateral regions over few micrometers across the heterojunction, showing a pure F8BT, a pure TFB and a mixed spectrum in between.

Figure 15:
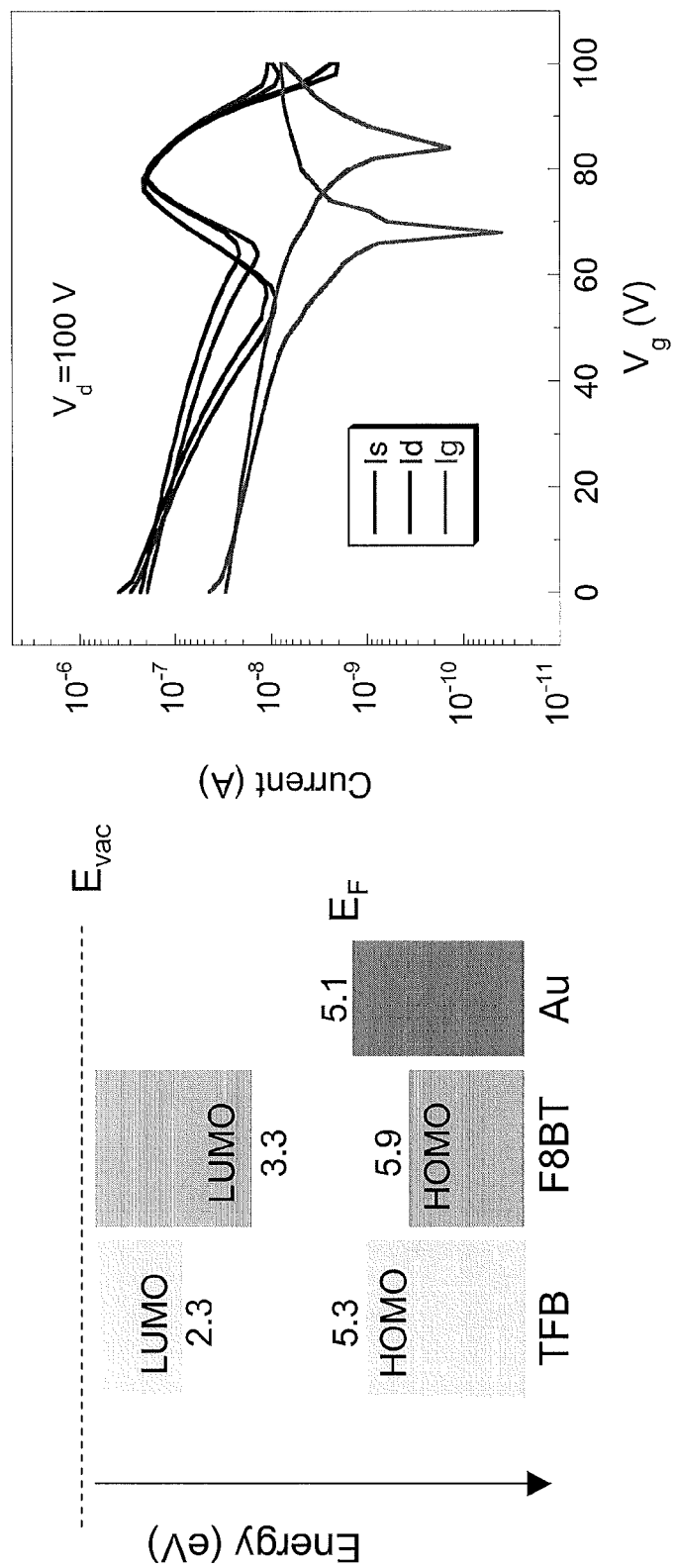

FIG. 15. (a) Highest occupied molecular orbital (HOMO) and lowest unoccupied molecular orbital (LUMO) levels of F8BT and TFB in relation to the work-function of Au. (b) Transfer characteristics for variable gate voltage Vg of a heterojunction LEFET with L=20 μm, W=4000 μm at Vd=100 V (Vs=0 V).

Figure 16:
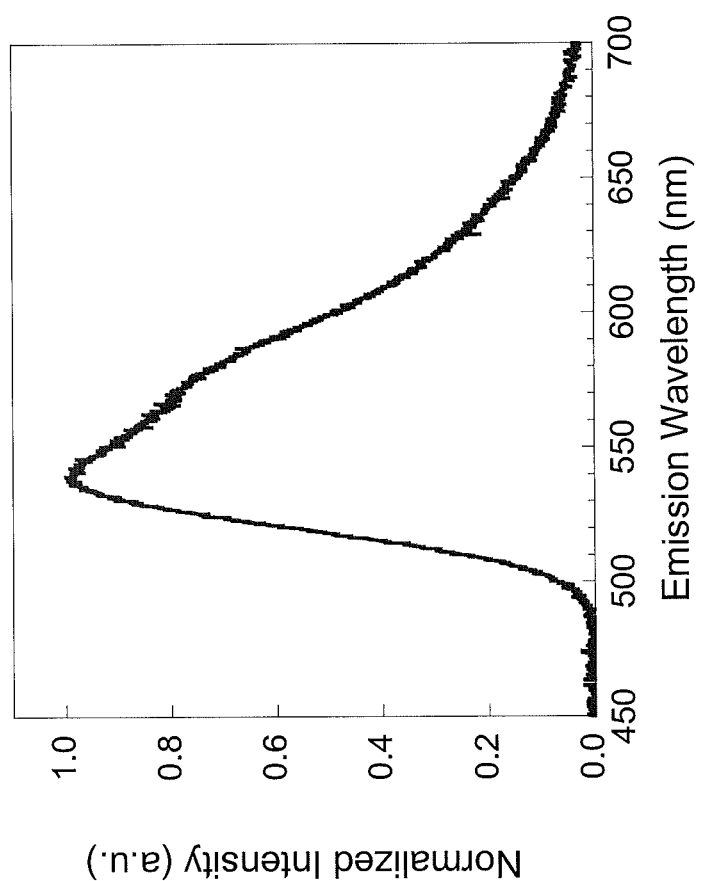

FIG. 16. Normalized electroluminescence spectrum of a F8BT/TFB heterojunction LEFET.

Figure 17:
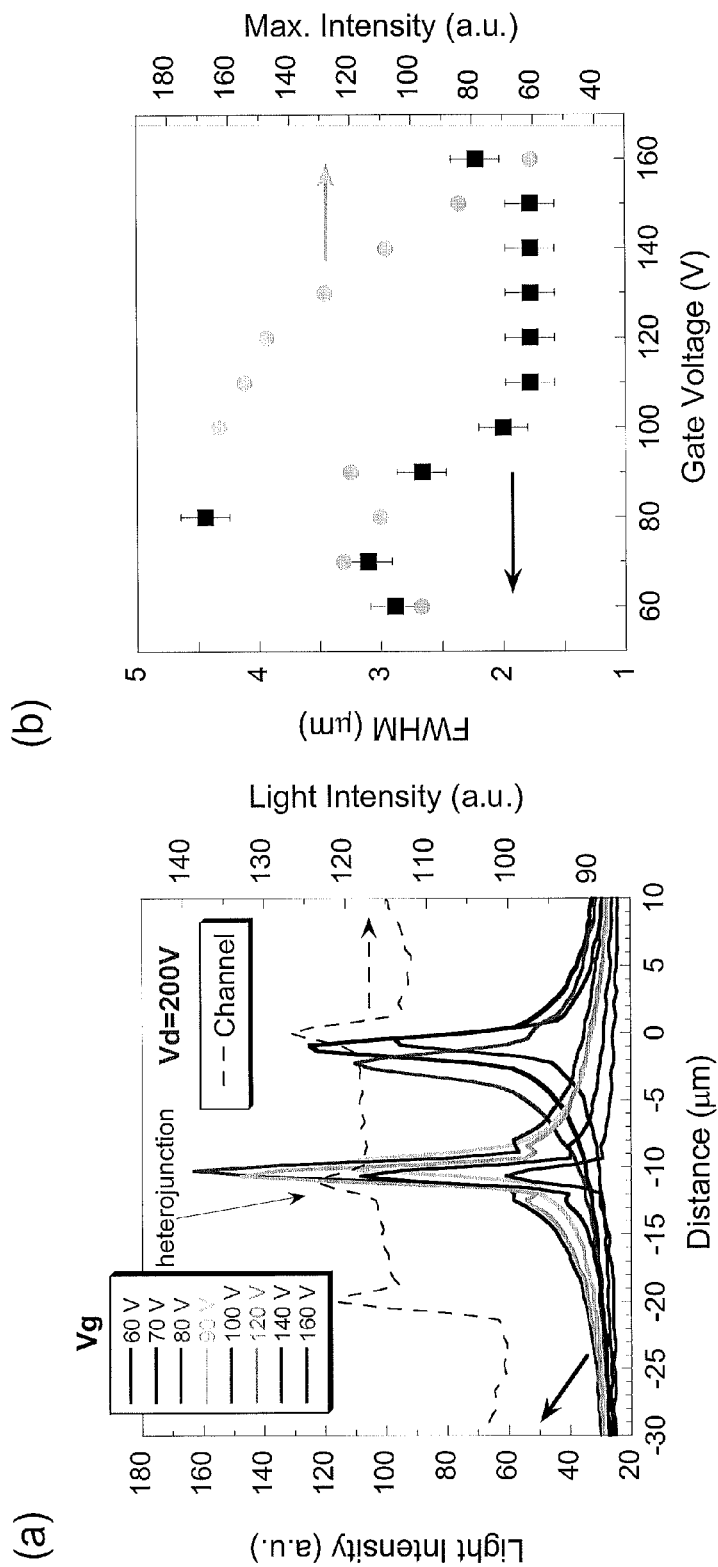

FIG. 17. Analytically converted light intensity of the emission inside the transistor channel. (a) Spatially resolved profiles of the transistor channel and the emitted light intensity inside the recombination zone as a function of Vg (Vd is fixed at 200 V). The electrode edges as well as the thicker TFB at the edge of the heterojunction appear brighter when illuminated with an external light source due to waveguiding effects. (b) Extracted full width at half maximum (FWHM) and maximum intensity of the converted light intensity of the recombination zone as a function of Vg.

Figure 18:
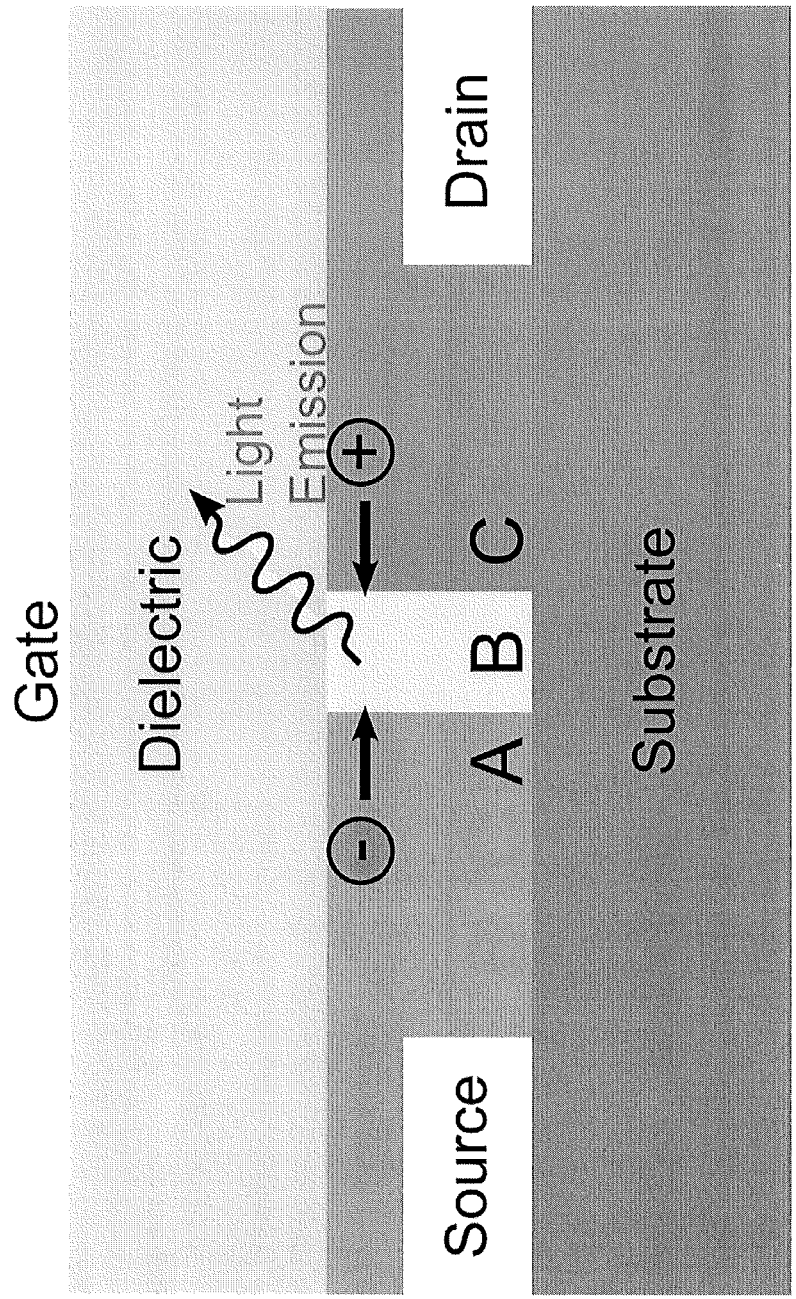

FIG. 18. Schematic illustration of an LEFET architecture with integrated ABC heterostructure combining a high-electron-mobility material A with a high-luminescence material B and a high-hole-mobility material C.

DETAILED DESCRIPTION OF PREFERRED EMBODIMENTS

General
Materials were obtained as follows:
PBTTT (Mw=28 kDa) and P3HT (Mw=22 kDa) from Merck Chemicals of United Kingdom.
F8BT (Mw=97 kDa) and TFB (Mw=119 kDa) from Cambridge Display Technologies Ltd.
F8T2 from Sumation Co., Ltd.
P(ND120D-T2) (Mw=250 kDa) from Polyera Corporation
Cytop (product no. CTL-809M from Asahi Glass Co.)
PMMA (poly(methylmethacrylate), Mn=255 kDa) from PolymerSource Inc.
A fluorosolvent (perfluorotributylamine, product no. CT-Soiv. 180) from Asahi Glass Co. was used to dissolve Cytop.

PBTTT solutions were prepared in 1,2-dichlorobenzene (~8 mg ml-1) and 1,2,4-trichlorobenzene (~5 mg ml-1) for bottom-gate and top-gate TFTs, respectively. P3HT solution was prepared in 1,2,4-trichlorobenzene with concentration of 10 mg ml$^{-1}$. Polymer solutions of F8BT, F8T2, and TFB were prepared in xylene with concentrations of 8, 7, and 10 mg ml$^{-1}$, respectively. P(ND120D-T2) solution was prepared in 1,2-dichlorobenzene with concentration of 9 mg ml$^{-1}$. PMMA solutions were prepared in anhydrous n-butyl acetate (~45 mg ml-1) to yield about 500 nm thickness.

All the top-gate transistors, complementary inverters and LEFETs were fabricated on Corning 1737F glass substrates.

Polymeric semiconductors and dielectrics were deposited by spin-coating. All processing steps except photolithographic patterning were carried out in dry nitrogen.

All the FET characterizations were carried out in a dry nitrogen glove-box with an Agilent 4155B semiconductor parameter analyzer. For heterojunction LEFETs, light-emission intensities were measured with a silicon photodiode (Hamamatsu S1133-01) mounted directly above the transistor channel. EL spectra were recorded with an Ocean Optics HR4000 spectrometer using an optical multi-mode fiber. Optical images of the recombination zone were taken with a view through the semitransparent gate electrode with a charge-coupled device (CCD) color video camera and a 100× objective.

FIG. 2(a) shows an array of precisely patterned 1-2 μm wide ridges of F8BT prepared according to the process described above in relation to FIG. 1 and after the removal of the Cytop with a fluorosolvent. The homogeneity over hundreds of micrometers is excellent. The inset contains an Atomic Force Microscopy (AFM) image showing that the $O_2$ plasma etching renders very sharp edges of the patterned features and that the surface of the patterned F8BT ridges is uniform with a small roughness of ~0.5 nm, which is as small as in pristine F8BT films. The corresponding photoluminescent (PL) image (FIG. 2(b)) provides clear evidence that the luminescent properties, even near the edge of the pattern, are undegraded. FIGS. 2(c) and (d) show corresponding images of larger F8BT islands, for which the Cytop layer has been delaminated with 3M tape. By investigating PL images of the surface of the Cytop film on the 3M tape after the process (FIG. 7) it is revealed that none of the F8BT is removed from the substrate when the Cytop is delaminated, as expected from the weak adhesion between Cytop and F8BT. FIG. 7(a) shows the optical microscopy images of delaminated Cytop layers on a 3M Scotch tape after being removed from the patterned large-area F8BT islands (FIG. 2(c)). From the corresponding PL image (FIG. 7(b)) it can be clearly seen that no F8BT residual can be observed on the delaminated Cytop layer, indicating an extremely weak intermixture between Cytop and F8BT films. Such a clean physical delamination was generally found in Cytop and varieties of investigated semi conducting polymers.

Patterning of the active semi conducting layer in FETs is essential to reduce cross-talk, leakage currents and parasitic channels between devices in integrated circuits. The patterning technique of the present invention can advantageously be applied to all common FET architectures. Patterning of bottom-gate devices is comparatively straightforward relative to patterning of top-gate devices. Patterned semicrystalline PBTTT films were successfully made to realize high-performance bottom-gate FETs on $SiO_2$ gate dielectrics (FIGS. 8(a) and (b)). The characteristics of the patterned devices are practically identical to those of unpatterned devices (mobility ~0.1 cm$^2$ V$^{-1}$ s$^{-1}$), except for a slightly positive turn-on voltage shift. Generally, the very weak intermixing and orthogonal solvents of Cytop and semi conducting polymers offers considerable latitude for working on different substrates with varying degrees of adhesion between the substrate and the organic semiconductor. For example, in the bottom-gate device configuration it is necessary to treat the $SiO_2$ gate dielectric with a hydrophobic self-assembled monolayer (hexamethyldisilazane (HMDS) in our case) to achieve high mobilities. This weakens the adhesion of the electronic or photonic material to the substrate. In such a case Cytop can be removed by dissolving in fluorosolvent (step 7(a) in FIG. 1) without disturbing the underlying semi conducting polymers. Alternatively, for a top-gate device configuration which is discussed in the following paragraphs, Cytop can be removed by solvent-free, physical delamination (step 7(b) in FIG. 1) in a $N_2$ atmosphere to avoid chemical and ambient exposure of top surfaces of organic semi conductors.

For bottom-gate PBTTT transistors (FIG. 8), bottom-contact source-drain electrodes were photolithographically patterned with a 15 nm thick Au layer using 3-mercaptopropyl-trimethoxysilane as an adhesion layer. A hexamethyldisilazane (HMDS) monolayer was deposited onto a heavily n-doped Si wafer with 300 nm thermally grown $SiO_2$ before the Au electrode surfaces were treated with 1H,1H,2H,2H-perfluorodecanethiol (PFDT) to increase their work function in order to reduce the contact resistance for bottom-contact devices. The PBTTT film was spin-coated from an 8 mg ml-1 solution in warm 1,2-dichlorobenzene and annealed at 180° C. for 10 min before being slowly cooled down to room temperature. A Cytop film of ~500 nm was spin-coated on top of the PBTTT film and annealed at 80° C. for 30 min. After photolithography and $O_2$ plasma etch, the photoresist (Shipley 1813) was stripped away with acetone and the patterned Cytop film was removed by dissolving with fluorosolvent (perfluoro-tributyl amine). Finally, the patterned PBTTT devices were annealed at 100° C. for 5 hours in the N2 atmosphere to remove moisture and oxygen residual induced in the patterning process.

In the case of the top-contact devices, 30 nm thick Au as source/drain electrodes were evaporated on top of the patterned PBTTT film. No obvious degradation induced by patterning technique was found in both bottom- and top-contact devices.

Moreover not only are the electrical transport properties of the patterned semi conducting polymer in the bulk and at the bottom interface with the substrate essentially unchanged compared to those of the pristine polymer films, but it is even possible to form high-mobility electron and hole accumulation layers on the top surface of the polymer films after patterning. For this it was first verified that the Cytop removal itself does not damage the film. This was demonstrated by spin coating a film of Cytop onto a continuous PBTTT film, delaminating the Ctyop film without patterning and then spinning a PMMA gate dielectric and comparing the device performance to that of a device in which the PMMA dielectric was deposited directly after forming the PBTTT film. Little difference was observed (FIG. 9(a)).

Top-gate devices were fabricated with a patterned PBTTT layer. The patterning process is similar to that of bottom-gate devices except that commonly an adhesive tape was used to delaminate the photoresist/Cytop layers instead of dissolving the photoresist and Cytop after $O_2$ plasma etch. The patterned PBTTT top-gate transistors have similar on-current but considerably enhanced on/off ratios by 2-3 orders of magnitude compared to the unpatterned devices (FIG. 3(a)). The off-current of the patterned devices is reduced down to the gate leakage level (10-11-10-12 A).

Similarly, little degradation and enhanced on/off ratios have also been observed in P3HT devices (FIG. 9(b)). P3HT is even more sensitive to accidental doping upon exposure to oxidizing species than PBTTT. The linear mobilities of the patterned/unpatterned PBTTT and P3HT top-gate devices with PMMA gate dielectric are ~$10^{-1}$ and ~$10^{-2}$ cm$^2$ V$^{-1}$ s$^{-1}$, respectively. These results show that the off-current that is commonly observed in unpatterned top-gate devices with these semicrystalline polymers is primarily attributed to parasitic leakage currents in the periphery of the device where no gate electrode is present to deplete the film, and not due to an ungateable leakage path in the channel.

FIG. 9(a) shows the control experiment to compare the transfer characteristics of unpatterned PBTTT top-gate TFTs with directly deposited PMMA and Cytop dielectrics, and re-deposited PMMA dielectric after delaminating Cytop dielectric. The thickness of all the dielectrics is 500 nm. The channel lengths and widths are 10 μm and 1000 μm, respectively. Whereas the PMMA and Cytop devices show different performance due to the different dielectric properties, it can be seen that the removal of a Cytop protective layer and the subsequent deposition of PMMA does not lead to any performance drawbacks, indicating the cleanness of the process.

To pattern PBTTT in top-gate transistors, the PBTTT film was spin-coated on a hydrophilic glass substrate from a 5 mg ml$^{-1}$ solution in warm 1,2,4-trichlorobenzene (TCB), and annealed at 180° C. for 10 min before being slowly cooled down. A Cytop film of ~500 nm was spin-coated on top of the PBTTT film and annealed at 80° C. for 30 min. After photolithography and $O_2$ plasma etch, the physical delamination of photoresist/Cytop was performed in $N_2$ atmosphere with 3M Scotch tape. After removing Cytop, a PMMA dielectric of ~500 nm, which was used for all top-gate devices if not stated otherwise, was spin-coated on the patterned PBTTT film and annealed at 80° C. for 30 min. Finally, an aluminum layer of ~20 nm was evaporated as the top gate electrode.

FIGS. 9(b)-(d) show the transfer characteristics of the top-gate TFTs with various semi conducting polymers. All the polymers investigated here show little degradation as compared with the unpatterned ones. The patterned P3HT top-gate transistors (FIG. 9(b)) were fabricated with the same device structure as the PBTTT devices. The P3HT film was deposited from a 10 mg ml$^{-1}$ solution in TCB and then annealed at 100° C. for 3 hours in $N_2$ atmosphere. For polyfluorene (F8BT, F8T2, and TFB) and P(NDI2OD-T2) top-gate transistors, we used a channel length of 40 μm and channel width of 20,000 μm. Polymer solutions of F8BT, F8T2, and TFB were prepared in xylene with concentrations of 8, 7, and 10 mg ml$^{-1}$, respectively. F8BT films were annealed at 290° C. for 20 min followed by being quenched. F8T2 and TFB films were dried at 80° C. for 10 min. The P(NDI2OD-T2) devices were deposited from a 9 mg ml$^{-1}$ solution in DCB and annealed at 110° C. overnight in $N_2$ atmosphere. After patterning a Cytop dielectric of ~500 nm was deposited and annealed at 110° C. for a few hours. Patterning of top-gate transistors with polyfluorene polymers such as F8BT (FIGS. 3(b) and 9(c)), poly-9,9'dioctyl-fluorene-co-bithiophene (F8T2) and poly(9,9-di-n-octylfluorene-alt-(1,4-phenylene-((4-sec-butyl-phenyl)imino)-1,4-phenylene)) (TFB), (FIG. 9(d)), also results in no evident degradation of the active materials. For F8BT devices with gold electrodes we observe clean ambipolar device characteristics. The patterned device has similar p-type (~6.2×$10^{-4}$ cm$^2$ V$^{-1}$ s$^{-1}$) and slightly lower but comparable n-type (~8× $10^{-4}$ cm$^2$ V$^{-1}$ s$^{-1}$) saturation mobilities than the unpatterned device. The electron current in F8BT almost diminishes when using Cytop as the gate dielectric (probably due to prevalent electron traps on the fluorinated surface), while the current recovers to the level of a standard PMMA device after replacing Cytop with PMMA dielectric (FIG. 3(b)). The saturation mobilities of the patterned F8T2 (1–2×$10^{-3}$ cm$^2$ V$^{-1}$ s$^{-1}$) and TFB devices (1–2×$10^{-4}$ cm$^2$ V$^{-1}$ s$^{-1}$) are essentially the same as in the unpatterned devices. Very little degradation is also found for n-type, top-gate FETs with a naphthalene-bis(dicarboximide) (NDI)-based high-mobility polymer P(NDI2OD-T2) (FIG. 3(c)). Both patterned and unpatterned devices show high electron mobilities of 0.1-0.2 cm$^2$ V$^{-1}$ s$^{-1}$ when using Cytop as gate dielectric.

The patterning process described in FIG. 1 can be further extended to fabricate device architectures comprised of multiple semi conductor components. Using solution-processed semi conducting polymers, it has been very challenging to produce well-defined lateral heterostructures due to the lack of orthogonal solvents and associated difficulties of controlling interfacial mixing/dissolution. In the methods of the invention, however, the Cytop layer protects the first patterned electronic or photonic material from solvent dissolution while depositing a second electronic or photonic material. A well-defined heterojunction is formed after a subsequent lift-off/delamination of the Cytop layer and the overlying undesired portions of second electronic or photonic material.

Based on the above-described technique a complementary inverter was fabricated using PBTTT and P(NDI2OD-T2) as the hole and electron transporting semiconductors, respectively (FIG. 4(a)). These two materials can be compatibly processed on the same substrate with similar mobilities of ~0.1 cm$^2$ V$^{-1}$ s$^{-1}$ and large on/off ratios using PMMA for the common gate dielectric. PBTTT and P(NDI2OD-T2) were patterned separately to form isolated islands in the p- and n-channel regions (or also directly joint regions if desired) with the process illustrated in FIG. 10. The inverter's static voltage transfer characteristic shows a nearly complete full output voltage swing with good symmetry (FIG. 4(b)). Voltage gains (dVout/dVin) of >10 and noise margins larger than 0.25×VDD can be achieved, thus showing that the present inverter can be a robust building block for the development of logic circuits.

FIG. 10 shows schematic process flow for patterning separate PBTTT and P(NDI2OD-T2) islands in the complementary inverter. A P(NDI2OD-T2) film was first deposited to cover the whole substrate and patterned P(NDI2OD-T2) to cover the n-channel region. The substrate was then modified with self-assembled monolayers (SAMs) (e.g., octyltrichlorosilane (OTS) on glass and PFDT on Au electrodes) to weaken the adhesion between the substrate and the subsequently deposited Cytop so that Cytop can be easily delaminated. Afterwards, Cytop was re-deposited and etched in the p-channel region and then a PBTTT film was spin-coated to cover the p-channel region. The Cytop/PBTTT above the SAMs/P(NDI2OD-T2) regions was delaminated with a 3M scotch tape. After removing Cytop, the patterned PBTTT/P (NDI2OD-T2) film was annealed at 180° C. for 10 min in $N_2$ atmosphere to improve the mobilities of PBTTT. Finally, a PMMA dielectric of ~500 nm was deposited as gate dielectric and an aluminum layer of ~20 nm was evaporated as the top gate electrode.

Furthermore, the methods of the present invention do not only allow for the individual use of several patterned regions, but to actually use their common interface. Using the photolithographic patterning technique, high-quality functional lateral semi conductor/semi conductor (e.g. polymeric semi conductor/polymeric semi conductor) heterojunctions can be fabricated. For example, a lateral heterojunction comprising a combination of F8BT and TFB, which has been commonly used as a blend system or vertical heterojunction for highly-efficient LEDs, can be prepared. As shown above, F8BT is capable of ambipolar transport, while TFB exhibits predominantly hole transport due to very low electron mobility. The energy offsets at the heterojunction confine the incoming holes and electrons on the TFB and F8BT side of the heterojunction, respectively. Luminescence is observed from F8BT, but in standard LED structures it is difficult to investigate how far the recombination zone extends into the F8BT region, i.e., how efficiently holes from the TFB region are injected into the F8BT. In the case of the LEFET investigated, the position of the heterojunction is aligned into the middle of the transistor channel, which allows for monitoring the properties of the heterojunction with the help of light-emission in the narrow recombination zone of electrons and holes within the channel.

Thus, according to the process shown in FIG. 11, a F8BT film was first patterned by photolithography to cover about half of the FET channel. The TFB film was then deposited from a xylene solution with the Cytop protective layer being still on top of the F8BT. Since F8BT is highly soluble in xylene, the patterned Cytop layer protects the F8BT film from being dissolved in xylene. The TFB film on top of the patterned F8BT film was then removed off together with the Cytop layer resulting in the formation of the lateral heterojunction.

The F8BT/TFB heterojunction inside a bottom contact TFT was patterned with the process shown in FIG. 11. The injecting source-drain electrodes were photolithographically patterned with an Au layer of 20 nm using a thin layer of chromium (0.7 nm) as an adhesion layer. The channel lengths and widths are 20 µm and 4000 µm, respectively. F8BT films of 40-50 nm thickness were spin-coated from a 8 mg ml$^{-1}$ solution of anhydrous xylene and annealed at 290° C. for 20 min before being quenched. Subsequently, 1 µm thick Cytop was spin-coated on top of the F8BT film. The F8BT and Cytop at the regions to be filled with TFB were etched by $O_2$ plasma with photolithographycially patterned photoresist as an etching mask. Acetone was used to remove photoresist before the TFB deposition. TFB films of 30-40 nm were spin-coated from a 10 mg ml$^{-1}$ solution of xylene. The Cytop layer was removed from the F8BT surface by physical delamination with a 3M Scotch tape. PMMA of ~500 nm was spin-coated from anhydrous n-butyl acetate to form the gate dielectric. The device was finished by thermally evaporating a thin (10 nm) semitransparent Au gate electrode through a shadow mask.

FIG. 5(a) shows optical microscopy and corresponding photoluminescence (PL) images of the heterojunction within the channel. The TFB side of the heterojunction is visible in the microscope image as a dark line due to the TFB being thicker by 100-140 nm near the edge as shown by the AFM cross-section in FIG. 12(a). This is primarily due to the edge bead produced when the TFB film is lifted off together with the relatively thick layer of Cytop (~1 µm). It has been found that lifting-off (i.e. delaminating) semi crystalline polymers such as PBTTT with lower molecular elasticity by the same process results in much less pronounced edge beads. In the PL image we observe a narrow region on the F8BT side of the heterojunction, in which the optical contrast due to the polycrystalline grain morphology of F8BT is less apparent and the film is slightly thinner (see AFM images in FIG. 12(b)). The narrow zone observed is believed to be due to the penetration of the xylene TFB solvent into the F8BT film which is protected by the Cytop layer from the top but exposed at the edge of the pattern. The xylene dissolves/swells the F8BT film at the edge of the pattern and upon solvent drying the film properties in this region are modified. This hypothesis is verified by a control experiment (see FIG. 12), in which pure xylene (without TFB) is used under otherwise identical process conditions.

FIG. 12(a) shows the AFM cross-section of F8BT/TFB heterojunction inside the 20 µm channel of a LEFET, which reveals a height of around 100-140 nm at the TFB edge of the heterojunction. This is primarily induced by a relatively thick layer of Cytop (~1 µm) used to cover the patterned F8BT film and the subsequent delamination process. The AFM image in FIG. 12(b) shows that this is a consequence of a slightly thinner F8BT film, which is attributed to an unavoidable penetration of the TFB solvent (xylene) into the side-wall of the patterned F8BT film underneath the Cytop layer. The xylene then dissolves a small amount of the already deposited F8BT and modifies the microstructures near the heterojunction within the short time of solvent exposure.

To investigate how a short-time solvent exposure modifies the microstructures of F8BT near the edge of a patterned film, a control experiment was been performed. FIG. 13 show the PL images of a patterned F8BT film covered with Cytop after the $O_2$ plasma etch before (a) and after (b) a subsequent xylene spinning on top. A thin strip region showing less crystallinity (appears as featureless PL) can be clearly seen at the edge of the patterned F8BT after the solvent exposure. This behaviour is in complete analogy to the results during the F8BT/TFB heterojunction fabrication.

A similarly wide, solvent-affected zone with reduced crystallinity is observed at the edge of the F8BT pattern. This suggests that results are the same as in the case of the heterojunction sample and thus exclude the unlikely formation of a local F8BT/TFB blend. To probe the chemical composition of the region within a few micrometers from the heterojunction confocal Raman microscopy was performed (FIG. 14).

FIG. 14 shows a 2D image of F8BT/TFB heterojunction performed by confocal Raman microscopy with a 1 µm spot size. The absolute intensity was plotted relative to the integration between 1510-1570 cm$^{-1}$ which corresponds to BT peak. On the F8BT side of the heterojunction a typical pure F8BT spectrum with a characteristic ratio of the fluorene ring stretch peak (1606 cm$^{-1}$) to the benzothiadiazole ring stretch peak (1544 cm$^{-1}$) is observed. On TFB side of the heterojunction a characteristic TFB spectrum is measured comprising peaks due to the (partially resolved) fluorene ring stretch (1606 cm$^{-1}$) and the phenylene ring stretch (1600 cm$^{-1}$). These spectra are in excellent agreement with the literature. Raman spectra in direct proximity of the heterojunction are mixed with all three peaks being detected, indicating the presence of both materials around the actual interface. From the 2D Raman image it was estimated that the intermixed F8BT/TFB region was close to 1 μm.

Spectra acquired with a 1 μm spot size in direct proximity of the heterojunction show signatures of both semiconductors. Despite the limited spatial resolution of the Raman microscope we can estimate an about 1 μm wide region at the heterojunction, in which F8BT and TFB are simultaneously present, which is considerably less than the width of the solvent-affected zone. Furthermore, the two-dimensional Raman image, in which the intensity is integrated over the BT peak, reveals that the F8BT edge of the heterojunction is abrupt. Whereas some TFB might be deposited on the F8BT side during the second spin coating possibly forming a layer on top of the slightly thinner F8BT, no F8BT is transferred to the TFB side. As a consequence, and although in this system due to the lack of suitable orthogonal solvents it is not possible to form a molecularly abrupt lateral heterojunction, we have found that there is excellent electrical continuity across the interface. The formation of a narrow mixed region at the heterojunction may even assist the charge-flow across the heterojunction by ensuring intimate contact between the F8BT and TFB layers.

A schematic diagram of a bottom contact/top gate LEFET based on such a F8BT/TFB heterojunction is shown in FIG. 5(b). The traditional nomenclature of source (s) and drain (d) is used to denote the injecting electrodes on the F8BT and TFB side, respectively. The transfer characteristics (see FIG. 5(c) and S9) measured at a drain voltage of Vd=100 V has a more complex shape than that of pure F8BT LEFETs (FIG. 3(b)).

FIG. 15 shows the transfer characteristics of a F8BT/TFB heterojunction LEFET measured at a fixed drain voltage of Vd=100 V with respect to the grounded source electrode. Sweeping the gate voltage between Vg=0 V and 100 V leads to a typical "V"-shape of an ambipolar FET with pure hole injection into TFB for small Vg and pure electron injection into F8BT for large Vg. For intermediate Vg values between 40 V and 80 V the device operates in the ambipolar regime, in which both carrier types are injected from respective electrodes. In this regime it becomes particularly obvious to which drastic consequences on hole and electron transport the heterojunction leads. Whereas holes are able to cross the heterojunction by passing the relatively small energy barrier (~0.6 eV) from the TFB into the F8BT region, the electrons injected into F8BT are stopped at the heterojunction due to the large energetic barrier into TFB (~1 eV). Consequently, the injected charges can only contribute to the source-drain current when sufficiently many holes are still transported at the same time. Therefore, the current starts to drop significantly for Vg≥80 V. Despite the electron-blocking inside the channel, the gate leakage current is found to be considerably smaller than the source-drain current, and only causes minor differences between the current recorded at source and drain. Throughout the transfer scan, the light emission always occurs in the F8BT, even when the recombination zone is pinned directly on the F8BT side of the heterojunction, as indicated by the pure F8BT electroluminescence (EL) spectrum of the LEFET in FIG. 16.

For Vg less than about 40 V the device operates in unipolar hole mode. A hole accumulation layer is present in both the F8BT and TFB layers and holes injected from the TFB side cross the relatively small energy barrier (HOMO levels of TFB and F8BT are 5.3 and 5.9 eV, respectively) for holes at the heterointerface and are transported through the F8BT. For intermediate Vg values between 40 V and 80 V the current goes through a minimum and the device operates in the ambipolar regime. Here electrons are injected from the source contact into F8BT and holes injected from the drain contact into TFB. As discussed below recombination occurs at a position inside the channel. However, for Vg>80 V we do not enter into a unipolar electron regime, as it would be the case for pure F8BT LEFETs (FIG. 3(b)), but the current decreases with increasing gate voltage instead. This is because TFB does not support the formation of an electron accumulation layer and/or electrons are unable to cross the larger energy barrier (LUMO levels of TFB and F8BT are 2.3 and 3.3 eV, respectively) at the heterojunction.

Figure 6:
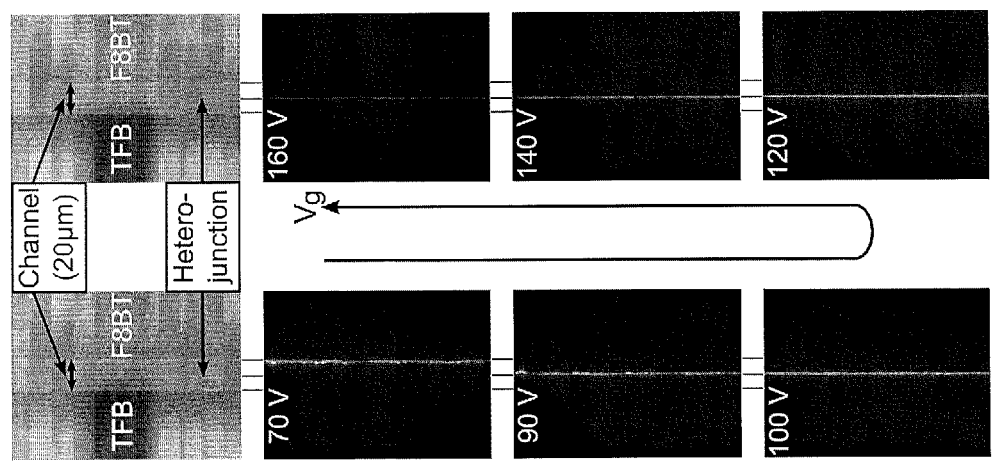

During a transfer scan the recombination zone moves along the channel. FIG. 6 shows a series of optical microscopy images for different gate voltages at fixed Vd=200 V. At around Vg=70 V we begin to observe light emission from the edge of the electron injecting source electrode. Due to the relatively large F8BT electron mobility ($0.5-1 \times 10^{-3}$ cm$^2$ V$^{-1}$ s$^{-1}$) compared to the TFB hole mobility (~$10^{-4}$ cm$^2$ V$^{-1}$ s$^{-1}$), the recombination zone moves rapidly throughout the F8BT region into the vicinity of the heterojunction (Vg=90 V), and reaches it for Vg≥100 V. The light intensity is maximum at this point. When further increasing Vg the recombination zone remains pinned at the heterojunction and does not move into the TFB region. The light intensity drops steadily in this regime with increasing gate voltage as the TFB region becomes increasingly depleted of holes and the current drops. At all voltages the electroluminescence (EL) spectrum of the LEFET (FIG. 17) is that of F8BT, i.e., the recombination occurs in F8BT, even when the recombination zone is pinned directly at the heterojunction.

With a photodiode on top of the semitransparent gate electrode the photocurrent was measured and the external quantum efficiency (EQE) of the LEFET for light outcoupling through the gate electrode extracted (FIG. 5(c)). The EQE is found to be maximum when the recombination zone is starting to get pinned at the heterojunction around Vg=50 V-70 V (Vd=100 V), which coincides with the region of minimum current in the transfer scan, where the electron and hole current are well-balanced. The maximum EQE is on the order of 1.2%. This value is higher than that of a pure F8BT LEFET, which might be explained by the additional electron/hole confinement occurring when the recombination zone is pinned at the heterojunction. This demonstrates the excellent quality of the heterojunction and excludes the possibility of luminescence-quenching sites due to F8BT degradation or other contamination caused by the patterning process. The high EQE is remarkable given that plasma etching and non-orthogonal solvents are used to define the side wall and the heterojunction, respectively.

External quantum efficencies (EQE) are calculated from the measured photocurrent. Taking into account the photodiode's sensitivity of 0.3 A W$^{-1}$, this relates to a light output power of P=$I_{ph}$/0.3 A W$^{-1}$. This absolute value represents the wavelength-integrated light power and is therefore proportional to a peak-normalized electroluminescence (EL) spectrum, detected with an optical fiber:

$$P \propto \int EL_{norm}(\lambda) d\lambda \qquad (1)$$

The energy E of an emitted photon of a particular wavelength λ is given by E=hc/λ, where h is the Planck constant and c the speed of light. The ratio P/E is the number of emitted photons N per second. As the EL spectrum is continuous, P/E must be weighted with the spectrum $EL_{norm}(\lambda)$ and integrated over all wavelengths, before being re-normalized by the integral over $EL_{norm}(\lambda)$:

$$N = \frac{\int \frac{P}{hc/\lambda} \cdot EL_{norm}(\lambda)d\lambda}{EL_{norm}(\lambda)d\lambda} = \frac{P}{hc} \cdot \frac{\int \lambda \cdot EL_{norm}(\lambda)d\lambda}{\int EL_{norm}(\lambda)d\lambda} \equiv X \cdot P \quad (2)$$

Analogously, the ratio Id/e of the transistor's source-drain current and the elementary charge describes the number of electrons per second. Hence, the external quantum efficiency (EQE) can be described and calculated with $$EQE = \frac{N}{I_d/e} = X \cdot \frac{P}{I_d/e} \quad (3)$$

The peak-normalized EL spectrum (see FIG. 16) gives a concrete value of X defined in equation (2). In this case, and with the sensitivity specifications of the photodiode, equation (3) for the external quantum efficiency can be simplified to:

$$EQE \approx 1.5377 \cdot \frac{I_{ph}}{I_d}$$

The photodiode used to record the photocurrent comprises a relatively small area, which has to be aligned to the light-emitting area of the transistor structure. In case of the T-shaped transistor architecture, which is used here, it is not possible to collect light from the entire recombination zone. Therefore, a scaling factor of ~1.43, determined by the ratio of recombination zone width W (4 mm) to the width of the photodiode (2.8 mm), was introduced to estimate the absolute external quantum efficiency.

By overlaying the electroluminescene images obtained under dark illumination conditions with images of the channel topography under bright illumination conditions it has been established that the recombination zone is indeed pinned at the heterojunction. In cross-sectional profiles of detected light intensity of the channel image (FIG. 17(a)) the heterojunction and the edges of the gold electrodes are visible as bright peaks due to enhanced outcoupling of the waveguided light from the illumination source.

FIG. 17 shows the detailed quantitative analysis of the recombination zone images. As all images including the image of the illuminated transistor channel show exactly the same position, the light intensity of the individual images can be converted into a spatially resolved profile across the channel. The position of the electrode edges and the thicker TFB edge of the heterojunction are visible as bright peaks due to waveguiding of the illuminating external light source. It can be seen that the recombination zone is initially located at the electron-injecting electrode for low Vg before it is shifted throughout the F8BT part for increasing Vg. However, for Vg values larger than 90 V the recombination zone gets pinned at the F8BT edge of the recombination zone before it is fading out for very large Vg. The respective light intensities reflect this behaviour by reaching a maximum once the recombination zone reaches the heterojunction. Whereas initially for small Vg light is quenched at the electrode, the intensity declines for larger Vg due to the lack of holes at the heterojunction. Interestingly, the width of the recombination zone is almost halved once it is pinned around the heterojunction with respect to the value when it is still inside pure F8BT region. The unusually large FWHM value at Vg=80 V is attributed to an instable position of the light emission as the recombination zone is about to move from the electron injecting electrode to the heterojunction, while the slight increase of FWHM at Vg=160 V is owing to a low signal/noise ratio.

Interestingly, a decrease in the full-width-at-half-maximum (FWHM) of recombination zone is observed when it becomes pinned at the heterojunction (FIG. 17(b)). When the recombination zone is in the F8BT region a few microns away from the heterojunction a FWHM of 3 μm is extracted which is similar to those found for pure F8BT LEFETs.

This shrinks to considerably less than 2 μm as soon as the emission zone becomes pinned at the heterojunction. This is believed to be a manifestation of enhanced recombination strength due to the spatial confinement of the charges at the heterojunction.

The significance of the patterning processes herein described is therefore at least twofold. It provides a robust, broadly applicable technology for high-resolution patterning of polymer semi conductor active layer islands for applications in FETs, LEDs and other devices without materials degradation, even when device performance depends critically on the quality of the top surface of the polymer film. It also enables realization of novel heterojunction device architectures that have previously been difficult to fabricate with solution-processible organic semiconductors. The heterojunction LEFETs demonstrated herein are an example. They offer a number of important advantages compared to LEFETs based on a single ambipolar organic semi conductor. The recombination zone can be positioned robustly at a well defined position in the channel, facilitating, for example, coupling of the emitted light into an integrated waveguide. With a single ambipolar semiconductor the position of the recombination shifts easily along the channel even when gate/drain voltages are kept constant due to bias stress effects. The charge carrier confinement at the heterojunction helps to achieve higher exciton densities and EQEs. Furthermore, the structure allows separate optimization of electron and hole mobilities for the two materials adjacent at the heterojunction. By judicious selection of the two organic semi conductors this should allow achieving higher current densities than those achievable with a single ambipolar semiconductor. Heterojunction LEFETs are therefore, an attractive architecture for low-loss integrated optoelectronic devices and potentially electrically pumped lasing.

The invention claimed is:

1. A method of patterning an electronic or photonic material on a substrate comprising:
   (a) forming a film of said electronic or photonic material on said substrate;
   (b) depositing a fluoropolymer as a layer on said film of said electronic or photonic material;
   (c) depositing a light sensitive layer on said fluoropolymer;
   (d) patterning said electronic or photonic material using photolithography and etching; and
   (e) removing regions of the light sensitive layer that remain after said patterning, wherein said fluoropolymer protects regions of said electronic or photonic material during one or more of steps (c), (d) and (e).

2. The method of claim 1, wherein said fluoropolymer is removed by dissolution in a solvent.

3. The method of claim 1, wherein the fluoropolymer comprises a perfluoropolymer.

4. The method of claim 1, wherein said fluoropolymer is removed by an adhesive.

5. A method of making an electronic device on a substrate comprising:
   forming a film of an organic semi conductor material on said substrate;

depositing a fluoropolymer as a layer on said film of said electronic or photonic material;

depositing a light sensitive layer on said fluoropolymer;

patterning said film of organic semi conductor material by using a fluoropolymer to protect regions of said organic semi conductor material during the patterning process; and removing regions of the light sensitive layer and the fluoropolymer that remain after patterning, wherein, in operation, said electronic device utilizes current flow through the surface of said organic semi conductor material which is in contact with the protective layer during patterning.

6. The method of claim 5, wherein said electronic device comprises a light-emitting diode.

7. The method of claim 5, wherein said electronic device comprises a top-gate field effect transistor.

8. The method of claim 5, further comprising depositing a dielectric on said organic semi conductor material.

9. The method of claim 8, further comprising the step of depositing a gate on said dielectric.

10. The method of claim 5, wherein said organic semi conductor material is deposited from solution.

11. A method of patterning at least a first electronic or photonic material and a second electronic or photonic material on a substrate comprising:

(A) patterning said first electronic or photonic material on a substrate by a method comprising:
  forming a film of said first electronic or photonic material on said substrate;
  depositing a fluoropolymer as a layer on said film of said electronic or photonic material; and
  using said fluoropolymer to protect regions of said electronic or photonic material during a patterning process; and (B) patterning said second electronic or photonic material by a method comprising:
  forming a film of said second electronic or photonic material on the pattern resulting from step (A); and
  selectively removing those regions of second electronic or photonic material having underlying fluoropolymer.

12. The method of claim 11, wherein said first and second materials form a lateral heterojunction.

13. The method of claim 11, wherein said film of said second electronic or photonic material fills the pattern of said first electronic or photonic material, overlaps the edges of said pattern and has regions extending beyond the edges of said pattern.

14. The method of claim 11, wherein said first and second electronic or photonic materials approach each other to a distance of less than 10 nm.

15. The method of claim 11, wherein said first and second electronic or photonic materials approach each other to a distance of less than 1 nm.

16. A method of patterning at least a first electronic or photonic material and a second electronic or photonic material on a substrate comprising:

(a) patterning said first electronic or photonic material on a substrate by a method comprising:
  forming a film of said first electronic or photonic material on said substrate;
  depositing a fluoropolymer as a layer on said film of said electronic or photonic material; and
  using said fluoropolymer to protect regions of said electronic or photonic material during a patterning process;

(b) depositing a further layer of fluoropolymer on said pattern of first electronic or photonic material and patterning said protective polymer; and (c) forming a film of said second electronic or photonic material on the pattern resulting from step (b); and (d) selectively removing those regions of second electronic or photonic material having underlying fluoropolymer.

17. The method of claim 16, wherein said first and second materials form completely separate regions.

18. The method of claim 16, wherein said film of said second electronic or photonic material fills the pattern of said patterned fluoropolymer, overlaps the edges of said pattern and has regions extending beyond the edges of said pattern.

19. The method of claim 16, wherein said film of said second electronic or photonic material is continuous.

20. The method of claim 16, wherein selective removal of regions of said second electronic or photonic material is carried out using an adhesive.

21. The method of claim 16, wherein selective removal of regions of said second electronic or photonic material is carried out using a solvent.

22. The method of claim 16, wherein one of said first and second electronic or photonic materials comprises an electronic material and the other comprises a photonic material.

23. The method of claim 16, wherein said second electronic or photonic material is deposited by solution processing.

24. The method of claim 16, wherein said electronic or photonic material comprises a conducting polymer, a polymer dielectric or a nanoparticulate material.

25. The method of claim 16, wherein said electronic or photonic material comprises an organic semi conductor.

26. The method of claim 16, wherein said electronic or photonic material comprises a conjugated non-polymeric semi conductor.

27. The method of claim 16, wherein said electronic or photonic material comprises a conjugated polymeric semi conductor.

28. The method of claim 16, wherein said film of electronic or photonic material is formed by solution deposition.

29. The method of claim 16, wherein said fluoropolymer is formed by solution deposition.

30. A method of patterning an electronic or photonic material on a substrate comprising:

(a) forming a film of said electronic or photonic material on said substrate;

(b) depositing a fluoropolymer as a layer on said film of said electronic or photonic material;

(c) depositing a surface energy modification layer on said fluoropolymer layer;

(d) depositing a light sensitive layer on said surface energy modification layer;

(e) patterning said electronic or photonic material using photolithography and etching; and (f) removing regions of the light sensitive layer that remain after patterning, wherein said fluoropolymer protects regions of said electronic or photonic material during one or more of steps (d), (e) and (f).

31. The method of claim 30, wherein said fluoropolymer is removed by dissolution in a solvent.

32. The method of claim 30, wherein the fluoropolymer comprises a perfluoropolymer.

33. The method of claim 30, wherein said fluoropolymer is removed by an adhesive.

* * * * *